US007799415B2

(12) United States Patent
Moriguchi et al.

(10) Patent No.: US 7,799,415 B2
(45) Date of Patent: Sep. 21, 2010

(54) SURFACE-COATED CUTTING TOOL WITH COATED FILM HAVING STRENGTH DISTRIBUTION OF COMPRESSIVE STRESS

(75) Inventors: Hideki Moriguchi, Itami (JP); Haruyo Fukui, Itami (JP); Shinya Imamura, Itami (JP); Koji Yamaguchi, Osaka (JP); Junji Iihara, Osaka (JP)

(73) Assignees: Sumitomo Electric Hardmetal Corp., Hyogo (JP); Sumitomo Electric Industries, Ltd., Osaka (JP)

( * ) Notice: Subject to any disclaimer, the term of this patent is extended or adjusted under 35 U.S.C. 154(b) by 1026 days.

(21) Appl. No.: 10/591,458

(22) PCT Filed: Jul. 1, 2005

(86) PCT No.: PCT/JP2005/012205

§ 371 (c)(1),
(2), (4) Date: Sep. 1, 2006

(87) PCT Pub. No.: WO2006/006429

PCT Pub. Date: Jan. 19, 2006

(65) Prior Publication Data

US 2007/0218242 A1 Sep. 20, 2007

(30) Foreign Application Priority Data

| | | | |
|---|---|---|---|
| Jul. 8, 2004 | (JP) | ............................ | 2004-202191 |
| Jul. 27, 2004 | (JP) | ............................ | 2004-218602 |
| Jul. 29, 2004 | (JP) | ............................ | 2004-222085 |
| Aug. 18, 2004 | (JP) | ............................ | 2004-238580 |

(51) Int. Cl.
*B32B 9/00* (2006.01)

(52) U.S. Cl. ........................ 428/218; 428/409; 428/698

(58) Field of Classification Search .................. 72/464; 83/432; 148/905; 407/29, 30, 46, 53, 113–119; 204/192.1, 192.15, 192.33, 192.36, 192.38; 428/698

See application file for complete search history.

(56) References Cited

U.S. PATENT DOCUMENTS 6,066,399 A * 5/2000 Hirano et al. ............... 428/408

FOREIGN PATENT DOCUMENTS

JP 2001-315006 A 11/2001

(Continued)

OTHER PUBLICATIONS

Milton Ohring, Materials Science of Thin Films, Deposition and Structure, 2nd Ed., No month 2004, p. 184, 748 and 749.*

(Continued)

*Primary Examiner*—Timothy M Speer
(74) *Attorney, Agent, or Firm*—McDermott Will & Emery LLP

(57) ABSTRACT

A surface-coated cutting tool according to the present invention includes a base material and a coated film formed on the base material. The coated film serves as an outermost layer on the base material and has compressive stress. The compressive stress is varied so as to have strength distribution in a direction of thickness of the coated film. The strength distribution is characterized in that the compressive stress at a surface of the coated film continuously decreases from the surface of the coated film toward a first intermediate point located between the surface of the coated film and a bottom surface of the coated film and the compressive stress attains a relative minimum point at the first intermediate point.

32 Claims, 5 Drawing Sheets

FOREIGN PATENT DOCUMENTS

| | | | |
|---|---|---|---|
| JP | 2001-353603 | A | 12/2001 |
| JP | 2003-113463 | A | 4/2003 |
| WO | WO 2006/009121 | A1 | 1/2006 |

OTHER PUBLICATIONS

D. D Sheeja, et al., Tribological properties and adhesive strength of DLC coatings prepared under different substrate bias voltages, No month 2001, Wear 249, p. 433-439.*

Fukaya et al., Machine translation of JP 2001-353603, Dec. 25, 2001.*

Bull and Jones, Surface and Coatings Technology, 78, No month 1996, pp. 173-184.*

Holleck and Schier, Surface and Coatings Technology, 76-77, No month 1995, pp. 328-336.*

U.S. Appl. No. 10/587,178, filed Jul. 25, 2006, Corresponds to WO 2006/009121.

* cited by examiner

SURFACE-COATED CUTTING TOOL WITH COATED FILM HAVING STRENGTH DISTRIBUTION OF COMPRESSIVE STRESS

RELATED APPLICATIONS

This application is the U.S. National Phase under 35 U.S.C. §371 of International Application No. PCT/JP2005/012205, filed on Jul. 1, 2005, which in turn claims the benefit of Japanese Application No. 2004-202191 filed on Jul. 8, 2004, Japanese Application No. 2004-218602 filed on Jul. 27, 2004, Japanese Application No. 2004-222085 filed on Jul. 29, 2004, and Japanese Application No. 2004-238580 filed on Aug. 18, 2004, the disclosures of which Applications are incorporated by reference herein.

TECHNICAL FIELD

The present invention relates to a cutting tool such as a drill, an end mill, a throw away tip for a drill, a throw away tip for an end mill, a throw away tip for milling, a throw away tip for turning, a metal saw, a gear cutting tool, a reamer, and a tap, and more particularly to a surface-coated cutting tool having a coated film for improving characteristics such as wear resistance formed on its surface (an outermost layer).

BACKGROUND ART

Conventionally, a hardmetal (a WC—Co alloy or an alloy obtained by adding a carbonitride of Ti (titanium), Ta (tantalum), Nb (niobium), or the like to the WC—Co alloy) has been used for a cutting tool. With a growing tendency toward high-speed cutting in recent years, a hard alloy tool has more increasingly been used, the hard alloy tool being obtained by coating a surface of a base material such as a hardmetal, cermet or ceramics based on alumina or silicon nitride with a coated film composed of a carbide, a nitride, a carbonitride, a boronitride, and an oxide of IVa-, Va- and VIa-group metal in the element periodic table or Al (aluminum) to a thickness of 3 to 20 μm, with the use of CVD (Chemical Vapor Deposition) or PVD (Physical Vapor Deposition).

In particular, as coating by means of PVD can improve wear resistance without deteriorating strength of the base material, it is widely used for a cutting tool in which strength is required, such as a drill, an end mill, and a throw away tip for milling or turning.

Recently, in order to further improve efficiency in a cutting process, a cutting speed has been increased. With such a tendency, further wear resistance is required in the tool. If high wear resistance is required, however, toughness is lowered. Therefore, achievement of both high wear resistance and high toughness has been demanded.

In an attempt to meet this demand, a method of varying an internal stress such as compressive stress continuously or in a stepped manner in a coated film formed on a surface of the base material for the cutting tool has been proposed (Japanese Patent Laying-Open No. 2001-315006 (Patent Document 1)). Such a proposal has produced some effect in meeting the demand for achievement of both wear resistance and toughness.

In the cutting tool according to the above-mentioned proposal, the compressive stress of the coated film uniformly increases or decreases from a side of a surface of the coated film toward a side of the surface of the base material. Therefore, in order to considerably improve toughness, the compressive stress should be increased from the side of the surface of the base material toward the side of the surface of the coated film. Meanwhile, in order to considerably improve the wear resistance, the compressive stress should be increased from the side of the surface of the coated film toward the side of the surface of the base material.

In other words, if maximum compressive stress is attained at the surface of the coated film, toughness is excellent whereas wear resistance is poor. This is because the compressive stress uniformly decreases, continuously or in a stepped manner, toward the surface of the base material. In contrast, if maximum compressive stress is attained at the surface of the base material, wear resistance is excellent whereas toughness is poor. This is because the compressive stress uniformly decreases, continuously or in a stepped manner, toward the surface of the coated film.

In particular, in the cutting tool attaining the maximum compressive stress at the surface of the coated film, the coated film tends to self-destruct due to that large compressive stress after the coated film is formed (after coating is finished) or when impact stress is applied. Then, minute film peeling (hereinafter, referred to as film chipping) tends to occur, which adversely affects appearance of the cutting tool and cutting performance in high-precision process.

As achievement of both toughness and wear resistance in the cutting tool of this kind is one of the most basic characteristics, a cutting tool attaining both of these characteristics at a higher level has been desired.

Patent Document 1: Japanese Patent Laying-Open No. 2001-315006

DISCLOSURE OF THE INVENTION

Problems to be Solved by the Invention

The present invention was made in view of the current situation as described above, and an object of the present invention is to provide a surface-coated cutting tool achieving excellent toughness and wear resistance in a cutting tool as well as suppression of film chipping.

MEANS FOR SOLVING THE PROBLEMS

As a result of dedicated study for solving the above-described problems, the present inventors have conceived that, if compressive stress at a surface portion of the coated film formed as an outermost layer on the base material is increased and a relative minimum point is formed in strength distribution of the compressive stress inside the coated film, stress such as impact or the like can be mitigated in the vicinity of the relative minimum point while high toughness at the surface is maintained, and resistance to film chipping and wear resistance may simultaneously be improved. The present invention was completed based on this conception and further study.

Specifically, a surface-coated cutting tool according to the present invention includes a base material and a coated film formed on the base material. The coated film serves as an outermost layer on the base material and has compressive stress. The compressive stress is varied so as to have strength distribution in a direction of thickness of the coated film, and the strength distribution is characterized in that the compressive stress at the surface of the coated film continuously decreases from the surface of the coated film toward a first intermediate point located between the surface of the coated film and a bottom surface of the coated film and the compressive stress attains a relative minimum point at the first intermediate point. As the relative minimum point is attained at the first intermediate point, self-destruction of the coated film or stress such as impact or the like is mitigated at this point, so that development of cracking toward the bottom surface of the coated film is effectively suppressed. Therefore, the first intermediate point is not located on (overlapped with) the bottom surface of the coated film, but located between the surface of the coated film and the bottom surface of the coated film as described above.

The surface-coated cutting tool according to the present invention mainly includes four embodiments, namely first to fourth embodiments as described below, as embodiments of the strength distribution (in particular, strength distribution from the first intermediate point toward the bottom surface of the coated film).

The strength distribution according to the first embodiment of the present invention is characterized in that a maximum compressive stress is attained at the surface of the coated film and the compressive stress maintains a constant value from the first intermediate point toward the bottom surface of the coated film.

Here, the compressive stress may be in a range from at least −15 GPa to at most 0 GPa. In addition, the first intermediate point may be located at a position distant from the surface of the coated film by at least 0.1% and at most 50% of the thickness of the coated film.

The compressive stress at the first intermediate point may be set to a value comparable to 20 to 90% of the compressive stress at the surface of the coated film.

Alternatively, the compressive stress at the first intermediate point may be set to a value comparable to 40 to 80% of the compressive stress at the surface of the coated film.

The compressive stress may attain the maximum value at the surface of the coated film, the maximum compressive stress may be maintained across a prescribed distance from the surface of the coated film toward the first intermediate point, and thereafter the compressive stress may continuously decrease toward the first intermediate point.

The strength distribution according to the second embodiment of the present invention is characterized in that the compressive stress continuously increases from the first intermediate point toward the bottom surface of the coated film.

Here, the compressive stress may be in a range from at least −15 GPa to at most 0 GPa. In addition, the first intermediate point may be located at a position distant from the surface of the coated film by at least 0.1% to at most 50% of the thickness of the coated film.

The compressive stress may attain the maximum value at the surface of the coated film. The compressive stress at the first intermediate point may be set to a value comparable to 20 to 90% of the compressive stress at the surface of the coated film.

Alternatively, the compressive stress at the first intermediate point may be set to a value comparable to 40 to 80% of the compressive stress at the surface of the coated film.

The compressive stress at the surface of the coated film may be maintained across a prescribed distance from the surface of the coated film toward the first intermediate point, and thereafter the compressive stress may continuously decrease toward the first intermediate point.

The strength distribution according to the third embodiment of the present invention is characterized in that the compressive stress continuously increases from the first intermediate point toward a second intermediate point located between the first intermediate point and the bottom surface of the coated film and attains a relative maximum point at the second intermediate point.

Here, the compressive stress may be in a range from at least −15 GPa to at most 0 GPa. In addition, the first intermediate point may be located at a position distant from the surface of the coated film by at least 0.1% to at most 50% of the thickness of the coated film. The second intermediate point may be located at a position distant from the surface of the coated film by at least 0.2% to at most 95% of the thickness of the coated film.

The compressive stress may attain the maximum value at the surface of the coated film. In addition, the compressive stress at the first intermediate point may be set to a value comparable to 20 to 90% of the compressive stress at the surface of the coated film.

Alternatively, the compressive stress at the first intermediate point may be set to a value comparable to 40 to 80% of the compressive stress at the surface of the coated film.

The compressive stress at the surface of the coated film may be maintained across a prescribed distance from the surface of the coated film toward the first intermediate point, and thereafter the compressive stress may continuously decrease toward the first intermediate point.

The strength distribution according to the fourth embodiment of the present invention is characterized in that the compressive stress continuously increases from the first intermediate point toward a second intermediate point located between the first intermediate point and the bottom surface of the coated film and attains a relative maximum point at the second intermediate point, and the strength distribution has one or more similar relative minimum point between the second intermediate point and the bottom surface of the coated film.

In addition, the strength distribution may have one or more similar relative maximum point between the second intermediate point and the bottom surface of the coated film. The strength distribution may have one or more similar relative minimum point and one or more similar relative maximum point in an alternate and repeated manner in this order between the second intermediate point and the bottom surface of the coated film.

All relative minimum points may attain substantially identical compressive stress and all relative maximum points may attain substantially identical compressive stress. Alternatively, all relative minimum points and all relative maximum points may have compressive stress values different from one another.

Here, the compressive stress may be in a range from at least −15 GPa to at most 0 GPa. In addition, the first intermediate point may be located at a position distant from the surface of the coated film by at least 0.1% to at most 40% of the thickness of the coated film. The second intermediate point may be located at a position distant from the surface of the coated film by at least 0.2% to at most 80% of the thickness of the coated film.

The maximum compressive stress may be attained at the surface of the coated film, and the compressive stress at the first intermediate point may be set to a value comparable to 10 to 80% of the compressive stress at the surface of the coated film.

Alternatively, the compressive stress at the first intermediate point may be set to a value comparable to 20 to 60% of the compressive stress at the surface of the coated film.

The compressive stress at the surface of the coated film may be maintained across a prescribed distance from the surface of the coated film toward the first intermediate point, and thereafter the compressive stress may continuously decrease toward the first intermediate point.

EFFECTS OF THE INVENTION

Being structured as described above, the surface-coated cutting tool according to the present invention achieves both excellent toughness and excellent wear resistance as well as improved resistance to film chipping.

In particular, as can be seen in the strength distribution according to the first embodiment described above, the maximum compressive stress is attained at the surface of the coated film, so that chipping or the like of the tool caused at an initial stage of cutting is effectively prevented and toughness of the cutting tool is improved. In addition, the relative minimum point in the strength distribution of the compressive stress is formed in a portion inside the coated film close to the surface, and this portion serves to effectively mitigate self-destruction of the coated film or stress such as impact or the like. Therefore, resistance to film chipping is drastically improved. Moreover, the compressive stress is maintained constant from the relative minimum point toward the bottom surface of the coated film, whereby wear resistance is drastically improved.

In addition, as can be seen in the strength distribution according to the second embodiment described above, the compressive stress at the surface of the coated film is larger than that inside the coated film, so that chipping or the like of the tool caused at an initial stage of cutting is effectively prevented and toughness of the cutting tool is improved. Moreover, the relative minimum point in the strength distribution of the compressive stress is formed in a portion inside the coated film close to the surface, and this portion serves to effectively mitigate self-destruction of the coated film or stress such as impact or the like, whereby resistance to film chipping is drastically improved and wear resistance is also simultaneously improved. In addition, the compressive stress increases from the relative minimum point toward the bottom surface of the coated film, whereby toughness is drastically improved.

Furthermore, as can be seen in the strength distribution according to the third embodiment described above, the compressive stress at the surface of the coated film is larger than that inside the coated film, so that chipping or the like of the tool caused at an initial stage of cutting is effectively prevented and toughness of the cutting tool is improved. In addition, the relative minimum point in the strength distribution of the compressive stress is formed in a portion inside the coated film close to the surface, and this portion serves to effectively mitigate self-destruction of the coated film or stress such as impact or the like, whereby resistance to film chipping is drastically improved and wear resistance is also simultaneously improved. Moreover, not only the relative minimum point but also the relative maximum point are provided, so that further toughness can be achieved in the vicinity of the relative maximum point.

In addition, as can be seen in the strength distribution according to the fourth embodiment described above, the compressive stress at the surface of the coated film is larger than that inside the coated film, so that chipping or the like of the tool caused at an initial stage of cutting is effectively prevented and toughness of the cutting tool is improved. Moreover, the relative minimum point in the strength distribution of the compressive stress is formed in a portion inside the coated film close to the surface, and this portion serves to effectively mitigate self-destruction of the coated film or stress such as impact or the like, whereby resistance to film chipping is drastically improved and wear resistance is also simultaneously improved. Furthermore, not only the relative minimum point but also the relative maximum point are provided, so that further toughness can be achieved in the vicinity of the relative maximum point. A plurality of such relative minimum points and relative maximum points are formed, whereby wear resistance and toughness as well as resistance to film chipping are further improved.

As described above, the present invention has successfully achieved both excellent toughness and excellent wear resistance as well as improvement in resistance to film chipping, as a result of having strength distribution of the compressive stress characterized as above.

DESCRIPTION OF THE REFERENCE CHARACTERS

Figure 1:
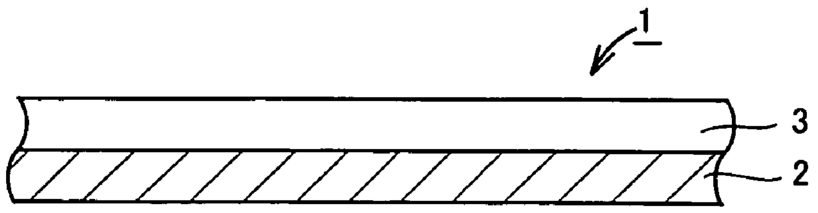
FIG. 1 is a schematic cross-sectional view of a surface-coated cutting tool according to the present invention.

1 surface-coated cutting tool; 2 base material; 3 coated film; 4 surface of coated film; 5 first intermediate point; 6 bottom surface of coated film; 7 arrow; 8 intermediate layer; 9 second intermediate point; 10 third intermediate point; and 11 fourth intermediate point.

BEST MODES FOR CARRYING OUT THE INVENTION

The present invention will be described hereinafter in further detail. Description of an embodiment will be given with reference to the drawings, and those having the same reference characters allotted represent the same or corresponding elements.

<Surface-Coated Cutting Tool>

As shown in FIG. 1, a surface-coated cutting tool 1 according to the present invention includes a base material 2 and a coated film 3 formed on the base material. Though coated film 3 is formed to be in direct contact with the surface of base material 2 in FIG. 1, any intermediate layer as will be described later may be formed between coated film 3 and base material 2, provided that coated film 3 serves as the outermost layer. In the subject application, the "coated film formed on the base material" is assumed to encompass a case in which any intermediate layer is formed.

Such a surface-coated cutting tool according to the present invention can suitably be used as a cutting tool such as a drill, an end mill, a throw away tip for a drill, a throw away tip for an end mill, a throw away tip for milling, a throw away tip for turning, a metal saw, a gear cutting tool, a reamer, or a tap, and among others, it is suitable for use in heavy cutting or interrupted cutting as well as for use in milling in particular. In these applications, the surface-coated cutting tool attains excellent toughness and wear resistance. In addition, as the surface-coated cutting tool attains excellent resistance to film chipping, finished surface roughness of a material to be cut is improved. Moreover, as excellent shine on a finished surface of the material to be cut is also achieved, process simultaneous with rough finishing is allowed.

<Base Material>

Any base material that has conventionally been known as a base material for the above-described kind of application may be used in the surface-coated cutting tool according to the present invention. For example, preferably, a hardmetal (such as WC-based hardmetal, a material containing Co in addition to WC, or a material to which carbonitride of Ti, Ta, Nb or the like is further added), cermet (mainly composed of TiC, TiN, TiCN or the like), a high-speed steel, ceramics (titanium carbide, silicon carbide, silicon nitride, aluminum nitride, aluminum oxide, or the like), sintered cubic boron nitride, or sintered diamond is employed.

Among these various base materials, in particular, the WC-based hardmetal, cermet or sintered cubic boron nitride is preferably selected. This is because these base materials are particularly excellent in balance between hardness at a high temperature and strength, and have characteristics excellent as the base material for the surface-coated cutting tool for the above-described application.

<Coated Film>

The coated film according to the present invention is formed on the base material described above and serves as the outermost layer. So long as the coated film is formed in such a manner, the coated film does not necessarily have to coat the entire surface of the base material, and a portion where the coated film is not formed or a portion not satisfying strength distribution of compressive stress which will be described later may be included in the surface of the base material. It is noted that the present invention encompasses a case in which, when a coated film is once formed and thereafter a part of the surface of the coated film is removed through some post-process, a layer newly exposed is qualified as the coated film satisfying the strength distribution of the compressive stress of the present invention. In addition, the present invention also encompasses a case in which, when an intermediate layer is formed between the base material and the coated film as will be described later and the coated film is removed through some post-process and the intermediate layer is exposed as the outermost layer as well, the intermediate layer in the exposed portion is qualified as the coated film satisfying the strength distribution of the compressive stress of the present invention (if the intermediate layer is formed of a plurality of layers, an outermost layer (a layer serving as a surface) among the plurality of layers serves as the coated film to which the present invention is directed to).

Such a coated film is formed in order to achieve improvement in various characteristics such as wear resistance, oxidation resistance, toughness of the tool, or coloring characteristic for identifying a used cutting edge portion. A composition of the coated film is not particularly limited, and a conventionally known composition can be adopted. For example, an exemplary composition includes a carbide, a nitride, an oxide, a carbonitride, an oxycarbide, an oxynitride, or a carbide-nitride-oxide of at least one element selected from the group consisting of IVa-group element (Ti, Zr, Hf or the like), Va-group element (V, Nb, Ta or the like), VIa-group element (Cr, Mo, W or the like) in the element periodic table, Al (aluminum), B (boron), Si (silicon), and Ge (germanium), or a solid solution thereof.

In particular, an exemplary suitable composition includes a nitride, a carbonitride, an oxynitride or a carbide-nitride-oxide of Ti, Al, $(Ti_{1-x}Al_x)$, $(Al_{1-x}V_x)$, $(Ti_{1-x}Si_x)$, $(Al_{1-x}Cr_x)$, $(Ti_{1-x-y}Al_xSi_y)$, or $(Al_{1-x-y}Cr_xV_y)$ (x or y represents any number not larger than 1) (a substance further containing B, Cr or the like may also be included).

More preferably, an exemplary composition includes TiCN, TiN, TiSiN, TiSiCN, TiAlN, TiAlCrN, TiAlSiN, TiAlSiCrN, AlCrN, AlCrCN, AlCrVN, TiBN, TiAlBN, TiSiBN, TIBCN, TiAlBCN, TiSiBCN, AlN, AlCN, AlVN, AlVCN, and the like. In these compositions, a ratio of each atom follows the exemplary general formula described above.

It is assumed that such a coated film is formed as a single-type layer. It is noted that the single-type layer herein refers to a structure in which the number of stacked layers may be set to one or more and the type of elements composing the layer is the same for each layer. Therefore, so long as the type of elements is the same, a structure formed by a plurality of layers different in a ratio of atom is also encompassed in the single-type layer herein.

In the coated film according to the present invention, in particular in its entirety, the type of the element and the ratio of atom are preferably the same. The single-type layer as described above, however, is assumed to encompass a super-multi-layer film structure in which one layer has a thickness less than 0.1 μm and different types of elements compose respective layers.

<Thickness of Coated Film>

Though not particularly limited, the coated film according to the present invention preferably has a thickness not smaller than 0.1 μm and not larger than 10 μm. If the thickness is less than 0.1 μm, in some cases, improvement in various characteristics as a result of formation of the coated film cannot sufficiently be obtained. Meanwhile, if the thickness exceeds 10 μm, the coated film itself may readily peel off.

<Method of Forming Coated Film>

Though a method of forming a coated film according to the present invention is not particularly limited, the coated film is preferably formed with physical vapor deposition (PVD).

Physical vapor deposition is adopted so that the compressive stress of the coated film can readily be varied so as to form strength distribution.

Namely, according to the study made by the present inventors, it has been found that the compressive stress of the coated film is affected by a temperature, a reactive gas pressure, a substrate bias voltage or the like when the coated film is formed with physical vapor deposition, and that it is most affected, among others, by the substrate bias voltage in particular at the time of formation of the coated film.

The reason is considered as follows. Specifically, for example, when a large substrate bias voltage is applied to the base material, an element composing the coated film is supplied in an ionized state to the base material at high energy. Then, impact when the element collides with the base material becomes greater, and consequently the compressive stress of the formed coated film becomes greater. In contrast, it is presumed that, if the substrate bias voltage is low, impact due to collision between the base material and the element in the ionized state is also small and consequently the compressive stress is also small.

Therefore, the strength distribution of the compressive stress of the coated film in a direction of thickness of the coated film can be obtained by adopting physical vapor deposition and by adjusting the substrate bias voltage when the coated film is formed on the base material. As will be described later, adjustment by means of mechanical impact or thermal shock, or annealing phenomenon using heat is also possible.

Though physical vapor deposition is preferably adopted as the method of forming the coated film according to the present invention, it is not intended to exclude chemical vapor deposition known as another method of forming a coated film.

An exemplary physical vapor deposition method includes a conventionally known method such as sputtering or ion plating in which a substrate bias voltage can be adjusted. Particularly, among various methods, ion plating or magnetron sputtering is preferably adopted.

Ion plating refers to the following method. Specifically, a metal is used as the cathode and a vacuum chamber is used as the anode. Then, the metal is evaporated and ionized, and concurrently a negative voltage (substrate bias voltage) is applied to the base material, so that ions are drawn and metal ions are deposited on the surface of the base material. In this method, if nitrogen is supplied into the vacuum and caused to react with the metal, a nitride of that metal is formed. For example, if titanium is employed as the metal and caused to react with nitrogen, titanium nitrogen (TiN) is formed.

There are various types of ion plating, however, cathode arc ion plating attaining high ion proportion of a raw element is particularly preferably adopted.

With the use of cathode arc ion plating, metal ion bombardment process on the surface of the base material can be performed before the coated film is formed. Accordingly, remarkable improvement in adhesion of the coated film can also effectively be achieved. Therefore, from the viewpoint of adhesion, cathode arc ion plating is a preferable process.

Meanwhile, magnetron sputtering refers to the following method. Specifically, after a vacuum chamber attains high vacuum, an Ar gas is introduced and a high voltage is applied to a target so as to cause glow discharge. Then, the target is irradiated with accelerated Ar ionized by the glow discharge, and the target is sputtered. The target atom that has flown out and been ionized is accelerated by the substrate bias voltage between the target and the substrate and deposited on the base material, whereby a film is formed. An exemplary magnetron sputtering method includes balanced magnetron sputtering, unbalanced magnetron sputtering and the like.

A method of controlling the substrate bias voltage using physical vapor deposition has been shown as a method of forming strength distribution of the compressive stress of the coated film, however, the present invention is not limited solely thereto. For example, a method of applying compressive stress by means of mechanical impact such as blast after formation of the coated film, a method of mitigating the compressive stress by using a heat source such as a heater, laser or the like, or a combined method of the former is possible.

<Compressive Stress of Coated Film>

The coated film according to the present invention has compressive stress. Preferably, the compressive stress is in a range from not smaller than −15 GPa to not larger than 0 GPa. More preferably, the lower limit of the compressive stress is set to −10 GPa and further preferably to −8 GPa, while the upper limit thereof is more preferably set to −0.5 GPa and further preferably to −1 GPa.

If the compressive stress of the coated film is lower than −15 GPa, the coated film may peel off particularly at a ridgeline portion of the cutting edge, depending on a shape of the cutting tool (such as a tool having a cutting edge with an extremely small included angle or a tool having a complicated shape). Meanwhile, if the compressive stress of the coated film is higher than 0 GPa, the stress of the coated film enters a tensile state. Then, a cracking is caused in the coated film, which results in chipping of the tool itself.

The compressive stress used herein represents one type of internal stress (intrinsic strain) present in the coated film, and is expressed by a "−" (minus) numeric value (unit: GPa). Therefore, the expression "large compressive stress (internal stress)" indicates that the absolute value of the numeric value above is large, whereas the expression "small compressive stress (internal stress)" indicates that the absolute value of the numeric value above is small.

The compressive stress in the present invention is measured with a $\sin^2\psi$ method. The $\sin^2\psi$ method using an X-ray is widely used as a method of measuring residual stress in a polycrystalline material. This measurement method is described in detail on pages 54-66 of "X-ray Stress Measurement" (The Society of Materials Science, Japan, 1981, published by Yokendo Co., Ltd.). In the present invention, initially, a penetration depth of the X-ray is fixed by combining an inclination method and a side inclination method, and various angles of diffraction $2\theta$ with respect to $\psi$ direction are measured in a plane including a direction of stress to be measured and a sample surface normal provided at a measurement position, so as to prepare a $2\theta$-$\sin^2\psi$ diagram. Average compressive stress to that depth (a distance from the surface of the coated film) can be found based on a gradient of the diagram. Similarly, the average compressive stress to a different depth is sequentially measured and a mathematical method is used to find the strength distribution of the compressive stress in a direction of thickness of the coated film.

More specifically, in a method of measuring the stress with the use of X-ray in which an X-ray from an X-ray source enters a sample at a prescribed angle, the X-ray diffracted by the sample is detected by an X-ray detector, and the internal stress is measured based on the detection value, the compressive stress inside the sample can be found in the following manner. An X-ray from an X-ray source enters a surface of the sample at an arbitrary portion of the sample at an arbitrarily set angle. When the sample is rotated around a $\omega$ axis passing through an X-ray irradiation point of the sample and forming at a right angle to the incident X-ray at the surface of the sample and around a $\chi$ axis coinciding with the incident X-ray when the $\omega$ axis is rotated in parallel to a sample carrier, the sample is rotated such that an angle between the surface of the sample and the incident X-ray is maintained constant, and an angle $\psi$ between the normal on a diffraction surface and the normal on a sample surface is varied, to measure a diffraction beam.

Here, synchrotron radiation (SR) is preferably employed as the X-ray source for finding the strength distribution in the direction of thickness of the coated film, from the viewpoint of a quality of the X-ray source (such as high luminance, high parallelism, wavelength variability, or the like).

In order to find the compressive stress from the $2\theta\text{-}\sin^2\psi$ diagram as described above, a Young's modulus and a Poisson's ratio of the coated film are necessary. Here, the Young's modulus can be measured by means of a dynamic hardness meter or the like, and as the Poisson's ratio, a value set around 0.2 is used. This is because the Poisson's ratio is not significantly varied from material to material. In the present invention, the strength distribution of the compressive stress is important, rather than particularly accurate compressive stress value. Therefore, in finding the compressive stress from the $2\theta\text{-}\sin^2\psi$ diagram, finding a lattice constant and an interplanar spacing instead of using the Young's modulus could replace the strength distribution of the compressive stress.

<Strength Distribution>

Figure 2:
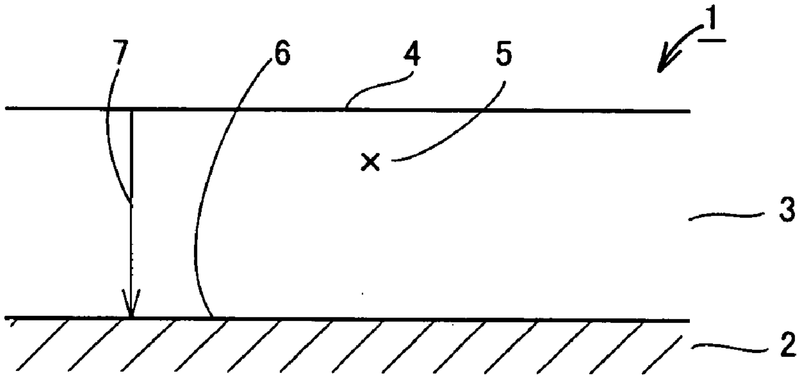
FIG. 2 is an enlarged schematic cross-sectional view of a portion in a coated film of the surface-coated cutting tool according to the present invention.

The compressive stress of the coated film according to the present invention is varied to have the strength distribution in the direction of thickness of the coated film. Here, the direction of thickness of the coated film refers to a direction from the surface of the coated film toward the bottom surface of the coated film (as the coated film serves as the outermost layer on the base material, the bottom surface refers to a surface closest to the base material, of the outermost layer) and a direction perpendicular to the surface of the coated film. Detailed description will be given with reference to FIG. 2 showing an enlarged cross-sectional view of a portion of coated film 3 of FIG. 1. Here, the direction in the thickness of the coated film is shown with an arrow 7 from a surface 4 of the coated film toward a bottom surface 6 of the coated film. Though arrow 7 is directed from surface 4 of the coated film to bottom surface 6 of the coated film for the sake of convenience, the direction is not necessarily limited to such an up-to-down direction, so long as the direction is perpendicular to the surface of the coated film. That is, the direction of thickness of the coated film may be directed from bottom surface 6 of the coated film to surface 4 of the coated film.

The strength distribution represents variation in a magnitude of the compressive stress in a manner forming distribution in the direction of thickness of the coated film. In other words, the strength distribution of the compressive stress in the direction of thickness of the coated film refers to variation in the magnitude of the compressive stress not in the direction in parallel to the surface of the coated film but in the direction perpendicular to the surface of the coated film.

The strength distribution is characterized in that the compressive stress attained at the surface of the coated film continuously decreases from the surface of the coated film toward the first intermediate point located between the surface of the coated film and the bottom surface of the coated film and the compressive stress attains the relative minimum point at the first intermediate point. In the following, first to fourth embodiments of the strength distribution will be described in detail.

Strength Distribution—First Embodiment

The first embodiment of the strength distribution is characterized in that the maximum compressive stress (in other words, the compressive stress attaining the largest absolute value) is attained at the surface of the coated film, that the compressive stress continuously decreases from the surface of the coated film toward the first intermediate point located between the surface of the coated film and the bottom surface of the coated film and attains a relative minimum point at the first intermediate point, and that the compressive stress maintains a constant value from the first intermediate point toward the bottom surface of the coated film.

Figure 3:
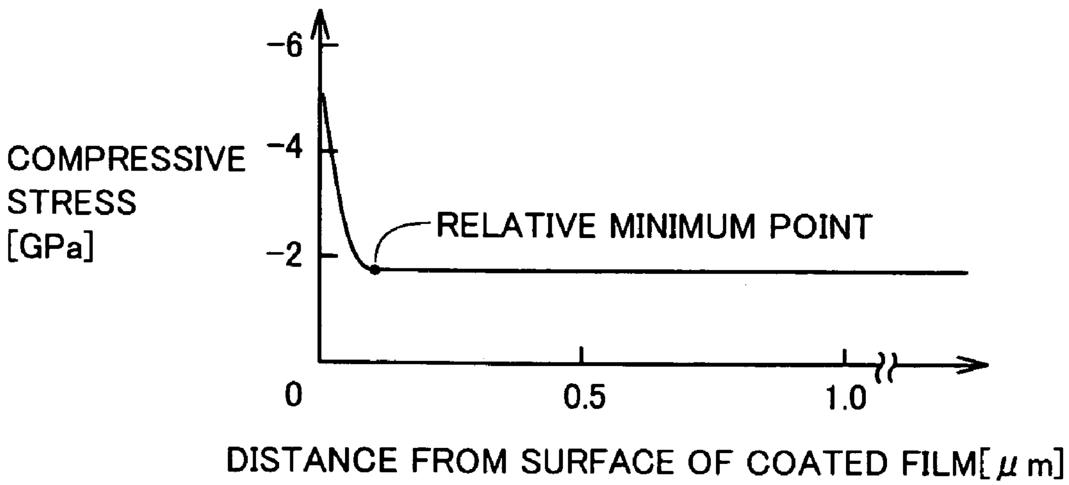
FIG. 3 is a graph showing a first embodiment of strength distribution of compressive stress of the coated film.

This characteristic will be described in detail with reference to FIG. 2 and FIG. 3 showing the first embodiment of the strength distribution of the present invention. FIG. 3 is a graph showing the strength distribution, in which the abscissa represents a distance from the surface of the coated film in the direction of thickness of the coated film and the ordinate represents the compressive stress.

Initially, as shown in FIG. 2, a first intermediate point 5 is located between surface 4 of the coated film and bottom surface 6 of the coated film. With regard to a distance in a perpendicular direction from surface 4 of the coated film, first intermediate point 5 does not necessarily have to be located at a position at a distance from the surface comparable to ½ of the thickness of the coated film (distance in the perpendicular direction from surface 4 of the coated film to bottom surface 6 of the coated film). Normally, first intermediate point 5 is located closer to surface 4 of the coated film than to bottom surface 6 of the coated film.

Preferably, first intermediate point 5 is located at a position at a distance from surface 4 of the coated film comparable to at least 0.1% to at most 50% of the thickness of the coated film (distance in the perpendicular direction from surface 4 of the coated film to bottom surface 6 of the coated film). More preferably, the lower limit of that distance is set to 0.3% and further preferably to 0.5% of the thickness, while the upper limit thereof is suitably set to 40% and further preferably to 35% of the same. If the distance less than 0.1% of the thickness is set and when the tool is used in harsh heavy cutting such as interrupted cutting in which impact force is high, application of the compressive stress is incomplete and effect of suppression of chipping cannot be exhibited. In addition, if the distance larger than 50% of the thickness is set, an effect from reduction in the compressive stress inside the coated film is lowered and improvement in resistance to film chipping may not be exhibited.

Preferably, the compressive stress at the first intermediate point is set to 20 to 90% of the compressive stress at the surface of the coated film. More preferably, the upper limit of the compressive stress at the first intermediate point is set to 85% and further preferably to 80% of the compressive stress at the surface, while the lower limit thereof is set to 30% and further preferably to 40% of the same.

If the compressive stress at the first intermediate point less than 20% of that at the surface is set, sufficient toughness may not be obtained. Meanwhile, if the compressive stress at the first intermediate point exceeds 90% of the compressive stress at the surface, impact absorption (relaxation of stress) is incomplete and effect of suppression of chipping may not be exhibited.

The relative minimum point is observed at first intermediate point 5 in terms of a position (in FIG. 3, a point distant from the surface of the coated film by approximately 0.1 μm), and it is shown that the compressive stress attaining the maximum value at the surface of the coated film (compressive stress having a value of approximately −5 GPa in FIG. 3) continuously decreases toward bottom surface 6 of the coated film and a degree of decrease changes at the relative minimum point. Here, change in the degree of decrease means that the value of the compressive stress starts to become constant toward the bottom surface of the coated film on reaching the relative minimum point, as shown in FIG. 3. Therefore, the meaning of relative minimum point herein is identical to, or broader than, the meaning of a relative minimum point which is a term used in connection with a function in mathematics.

A single relative minimum point is present in the strength distribution described above, which is fundamentally different from the variation in the stepped manner in Patent Document 1.

Figure 4:
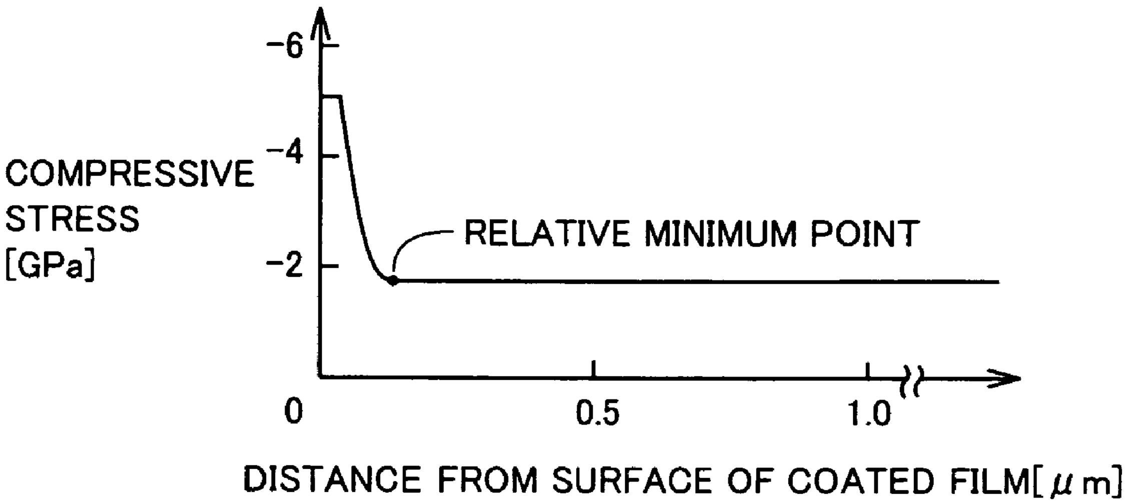
FIG. 4 is a graph showing the first embodiment of strength distribution of compressive stress of the coated film when maximum compressive stress at the surface of the coated film is maintained across a prescribed distance.

In FIG. 3, the compressive stress attains the maximum only at the surface of the coated film (that is, a point distant from the surface of the coated film by 0 μm), however, the embodiment of the present invention is not limited to such a case that the maximum compressive stress is attained only at the point distant from the surface of the coated film by 0 μm. Namely, as shown in FIG. 4, the present invention encompasses also a case in which the maximum compressive stress is maintained from the surface of the coated film toward the bottom surface of the coated film across a prescribed distance range (preferably not larger than 0.5 μm). In other words, the present invention includes an embodiment in which the compressive stress attains the maximum at the surface of the coated film, the maximum compressive stress is maintained across a prescribed distance (preferably not larger than 0.5 μm) from the surface of the coated film toward the first intermediate point, and thereafter the compressive stress continuously decreases toward the first intermediate point.

As described above, when the maximum compressive stress at the surface of the coated film is maintained across a prescribed distance range from the surface of the coated film toward the bottom surface of the coated film, particularly excellent toughness is attained, which is preferable.

The case in which the compressive stress continuously decreases from the surface of the coated film toward the first intermediate point encompasses not only a case in which the compressive stress decreases in a manner convex downward as shown in FIG. 3 but also a case in which the compressive stress decreases in a manner convex upward or linearly decreases. In addition, provided that the compressive stress decreases from the surface of the coated film toward the first intermediate point as a whole, the case of continuous decrease herein encompasses a case in which the compressive stress increases in a part, or a case in which the degree (slope) of decrease changes at some midpoint or the change is made in a stepped manner (decrease in the stepped manner).

The case in which the value of the compressive stress is maintained constant from the first intermediate point toward the bottom surface of the coated film encompasses not only a case in which the compressive stress is set to an exactly constant value but also a case in which the compressive stress is set to a substantially constant value.

As described above, according to the first embodiment of the strength distribution of the present invention, the compressive stress attains the maximum value at the surface of the coated film, and the compressive stress continuously decreases from the surface of the coated film toward the first intermediate point located between the surface of the coated film and the bottom surface of the coated film and attains the relative minimum point at the first intermediate point. The maximum compressive stress is attained at the surface of the coated film, so that occurrence of cracking on the surface of the coated film is suppressed as much as possible, self-destruction of the coated film due to large compressive stress at the surface of the coated film is prevented in the vicinity of the relative minimum point, and stress such as impact applied to the surface of the coated film is mitigated. Accordingly, pronounced effect of excellent toughness and resistance to film chipping is exhibited.

Moreover, according to the first embodiment of the strength distribution of the present invention, the compressive stress maintains a constant value from the first intermediate point to the bottom surface of the coated film, so that self-destruction of the coated film can be suppressed and extremely excellent wear resistance is provided. In this manner, the surface-coated cutting tool according to the present invention attains an extremely excellent effect in successfully achieving toughness, wear resistance and resistance to film chipping.

Such an excellent effect cannot be exhibited in the conventional surface-coated cutting tool (Patent Document 1) characterized in that there is no relative minimum point and that the compressive stress uniformly increases or decreases from the surface of the coated film toward the bottom surface of the coated film continuously or in a stepped manner.

Strength Distribution—Second Embodiment

The second embodiment of the strength distribution is characterized in that the compressive stress at the surface of the coated film continuously decreases from the surface of the coated film toward the first intermediate point located between the surface of the coated film and the bottom surface of the coated film and the compressive stress attains the relative minimum point at the first intermediate point, and that the compressive stress continuously increases from the first intermediate point toward the bottom surface of the coated film.

Figure 6:
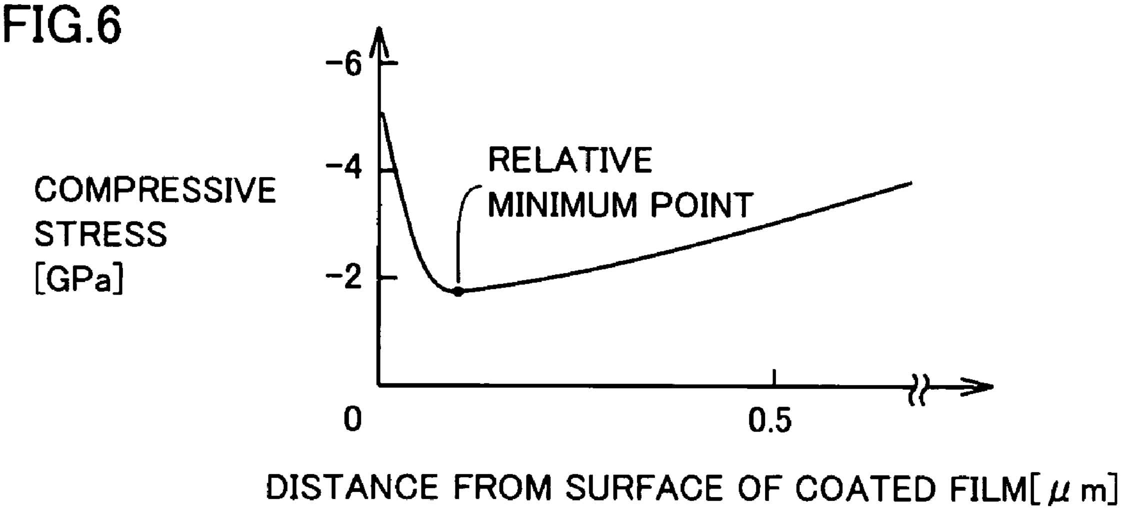
FIG. 6 is a graph showing a second embodiment of strength distribution of compressive stress of the coated film.

This characteristic will be described in detail with reference to FIG. 2 and FIG. 6 showing the second embodiment of the strength distribution of the present invention. FIG. 6 is a graph showing the strength distribution, in which the abscissa represents a distance from the surface of the coated film in the direction of thickness of the coated film and the ordinate represents the compressive stress.

Initially, as shown in FIG. 2, first intermediate point 5 is located between surface 4 of the coated film and bottom surface 6 of the coated film. With regard to a distance in a perpendicular direction from surface 4 of the coated film, first intermediate point 5 does not necessarily have to be located at a position at a distance from the surface comparable to ½ of the thickness of the coated film (distance in the perpendicular direction from surface 4 of the coated film to bottom surface 6 of the coated film). Normally, first intermediate point 5 is located closer to surface 4 of the coated film than to bottom surface 6 of the coated film.

Preferably, first intermediate point 5 is located at a position at a distance from the surface of the coated film comparable to at least 0.1% to at most 50% of the thickness of the coated film (distance in the perpendicular direction from surface 4 of the coated film to bottom surface 6 of the coated film). More preferably, the lower limit of that distance is set to 0.3% and further preferably to 0.5% of the thickness, while the upper limit thereof is suitably set to 40% and further preferably to 35% of the same. If the distance less than 0.1% of the thickness is set and when the tool is used in harsh heavy cutting such as interrupted cutting in which impact force is high, application of the compressive stress is incomplete and effect of suppression of chipping may not be exhibited. In addition, if the distance larger than 50% of the thickness is set, an effect from reduction in the compressive stress inside the coated film is lowered and improvement in resistance to film chipping may not be exhibited.

In such strength distribution, the compressive stress may attain the maximum value at surface 4 of the coated film (in other words, the compressive stress attains the largest absolute value). Accordingly, particularly excellent toughness can be obtained. Meanwhile, the compressive stress may attain the maximum value also at bottom surface 6 of the coated film (in other words, the compressive stress attains the largest absolute value). In this case as well, excellent toughness can be obtained.

Preferably, the compressive stress at the first intermediate point is set to 20 to 90% of the compressive stress at the surface of the coated film. More preferably, the upper limit of the compressive stress at the first intermediate point is set to 85% and further preferably to 80% of the compressive stress at the surface, while the lower limit thereof is set to 30% and further preferably to 40% of the same.

If the compressive stress at the first intermediate point less than 20% of that at the surface is set, sufficient toughness may not be obtained. Meanwhile, if the compressive stress at the first intermediate point exceeds 90% of the compressive stress at the surface, impact absorption (relaxation of stress) is incomplete and effect of suppression of chipping may not be exhibited.

The relative minimum point is observed at the first intermediate point in terms of a position (in FIG. 6, a point distant from the surface of the coated film by approximately 0.1 μm), and it is indicated that the compressive stress at the surface of the coated film (compressive stress having a value of approximately −5 GPa in FIG. 6) continuously decreases toward bottom surface 6 of the coated film and the degree of decrease changes at the relative minimum point. Here, change in the degree of decrease means that the value of the compressive stress starts to continuously increase toward the bottom surface of the coated film on reaching the relative minimum point, as shown in FIG. 6.

In FIG. 6, the relative minimum point is present only at the first intermediate point, however, the embodiment of the present invention is not limited thereto, and encompasses also a case in which the relative minimum point is present with a certain thickness in the direction of thickness of the coated film. Here, the relative minimum point being present with a certain thickness refers to a case in which the compressive stress at the relative minimum point is maintained substantially constant from the first intermediate point across that thickness (preferably, not larger than ½ of the thickness of the coated film). As described above, the relative minimum point is present with a certain thickness from the first intermediate point, so that wear resistance can further be improved.

Therefore, the meaning of relative minimum point herein is identical to, or broader than, the meaning of a relative minimum point which is a term used in connection with a function in mathematics.

Figure 7:
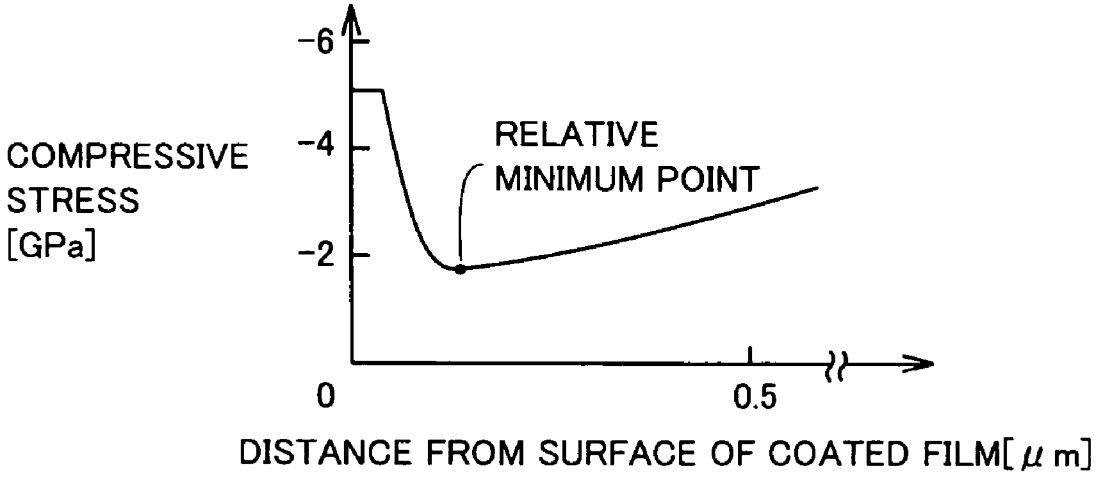
FIG. 7 is a graph showing the second embodiment of strength distribution of compressive stress of the coated film when compressive stress at the surface of the coated film is maintained across a prescribed distance.

In FIG. 6, the compressive stress continuously decreases from the surface of the coated film (that is, a point distant from the surface of the coated film by 0 μm), however, the embodiment of the present invention is not limited thereto. Namely, for example, as shown in FIG. 7, the present invention encompasses also a case in which the compressive stress at the surface of the coated film is maintained toward the bottom surface of the coated film across a prescribed distance range (preferably not larger than 0.5 μm). In other words, the present invention includes an embodiment in which the compressive stress at the surface of the coated film is larger than in the inside (in other words, the absolute value of that compressive stress is larger than the absolute value of the compressive stress in the inside), and the compressive stress is maintained across a prescribed distance (preferably not larger than 0.5 μm) from the surface of the coated film toward the first intermediate point and thereafter continuously decreases toward the first intermediate point.

As described above, when the compressive stress at the surface of the coated film is maintained across a prescribed distance range from the surface of the coated film toward the bottom surface of the coated film, particularly excellent toughness is attained, which is preferable.

The case in which the compressive stress continuously decreases from the surface of the coated film toward the first intermediate point encompasses not only a case in which the compressive stress decreases in a manner convex downward as shown in FIG. 6 but also a case in which the compressive stress decreases in a manner convex upward or linearly decreases. In addition, provided that the compressive stress decreases from the surface of the coated film toward the first intermediate point as a whole, the case of continuous decrease herein encompasses a case in which the compressive stress increases in a part, or a case in which the degree (slope) of decrease changes at some midpoint, or the change is made in a stepped manner (decrease in the stepped manner).

The case that the compressive stress continuously increases from the first intermediate point toward the bottom surface of the coated film encompasses not only a case in which the compressive stress increases in a manner convex downward as shown in FIG. 6 but also a case in which the compressive stress increases in a manner convex upward or linearly increases. In addition, provided that the compressive stress increases from the first intermediate point toward the bottom surface of the coated film as a whole, the case of continuous increase herein encompasses a case in which the compressive stress decreases in a part, or a case in which the degree (slope) of increase changes at some midpoint, or the change is made in a stepped manner (increase in the stepped manner).

As described above, according to the second embodiment of the strength distribution of the present invention, the compressive stress at the surface of the coated film continuously decreases from the surface of the coated film toward the first intermediate point located between the surface of the coated film and the bottom surface of the coated film and the compressive stress attains the relative minimum point at the first intermediate point. The compressive stress at the surface of the coated film is larger than that in the inside, so that occurrence of cracking on the surface of the coated film is suppressed as much as possible, self-destruction of the coated film due to large compressive stress at the surface of the coated film is prevented in the vicinity of the relative minimum point, and stress such as impact applied to the surface of the coated film is mitigated. Accordingly, pronounced effect of excellent toughness and resistance to film chipping as well as wear resistance is exhibited.

Moreover, according to the second embodiment of the strength distribution of the present invention, the compressive stress continuously increases from the first intermediate point toward the bottom surface of the coated film, so that self-destruction of the coated film can be suppressed and extremely excellent toughness is provided. In this manner, the surface-coated cutting tool according to the present invention attains an extremely excellent effect in successfully achieving toughness, wear resistance and resistance to film chipping.

Such an excellent effect cannot be exhibited in the conventional surface-coated cutting tool (Patent Document 1) characterized in that there is no relative minimum point and that the compressive stress uniformly increases or decreases from the surface of the coated film toward the bottom surface of the coated film continuously or in a stepped manner.

Strength Distribution—Third Embodiment

The third embodiment of the strength distribution is characterized in that the compressive stress at the surface of the coated film continuously decreases from the surface of the coated film toward the first intermediate point located between the surface of the coated film and the bottom surface of the coated film and the compressive stress attains the relative minimum point at the first intermediate point, and that the compressive stress continuously increases from the first intermediate point toward the second intermediate point located between the first intermediate point and the bottom surface of the coated film and attains the relative maximum point at the second intermediate point.

Figure 8:
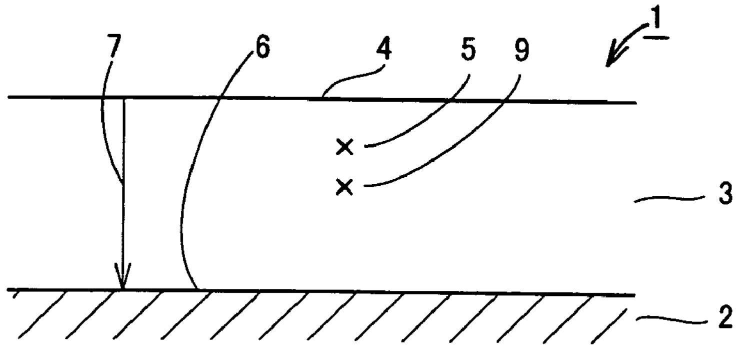
FIG. 8 is another enlarged schematic cross-sectional view of a portion in a coated film of the surface-coated cutting tool according to the present invention.
Figure 9:
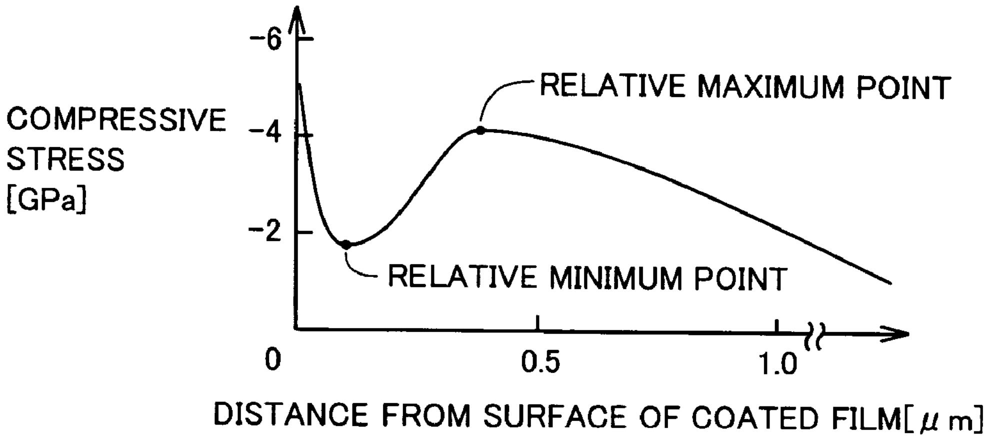
FIG. 9 is a graph showing a third embodiment of strength distribution of compressive stress of the coated film.

This characteristic will be described in detail with reference to FIG. 8 and FIG. 9 showing the third embodiment of the strength distribution of the present invention. FIG. 9 is a graph showing the strength distribution, in which the abscissa represents a distance from the surface of the coated film in the direction of thickness of the coated film and the ordinate represents the compressive stress.

Initially, as shown in FIG. 8, first intermediate point 5 is located between surface 4 of the coated film and bottom surface 6 of the coated film. With regard to a distance in a perpendicular direction from surface 4 of the coated film, first intermediate point 5 does not necessarily have to be located at a position at a distance from the surface comparable to ½ of the thickness of the coated film (distance in the perpendicular direction from surface 4 of the coated film to bottom surface 6 of the coated film). Normally, first intermediate point 5 is located closer to surface 4 of the coated film than to bottom surface 6 of the coated film.

Preferably, first intermediate point 5 is located at a position at a distance from surface 4 of the coated film comparable to at least 0.1% to at most 50% of the thickness of the coated film (distance in the perpendicular direction from surface 4 of the coated film and bottom surface 6 of the coated film). More preferably, the lower limit of that distance is set to 0.3% and further preferably to 0.5% of the thickness, while the upper limit thereof is suitably set to 40% and further preferably to 35% of the same. If the distance less than 0.1% of the thickness is set and when the tool is used in harsh heavy cutting such as interrupted cutting in which impact force is high, application of the compressive stress is incomplete and effect of suppression of chipping may not be exhibited. In addition, if the distance larger than 50% of the thickness is set, an effect from reduction in the compressive stress inside the coated film is lowered and improvement in resistance to film chipping may not be exhibited.

In such strength distribution, the compressive stress may attain the maximum at surface 4 of the coated film (in other words, the compressive stress attains the largest absolute value). Accordingly, particularly excellent toughness can be obtained.

Preferably, the compressive stress at the first intermediate point is set to 20 to 90% of the compressive stress at the surface of the coated film. More preferably, the upper limit of the compressive stress at the first intermediate point is set to 85% and further preferably to 80% of the compressive stress at the surface, while the lower limit thereof is set to 30% and further preferably to 40% of the same.

If the compressive stress at the first intermediate point less than 20% of that at the surface is set, sufficient toughness may not be obtained. Meanwhile, if the compressive stress at the first intermediate point exceeds 90% of the compressive stress at the surface, impact absorption (relaxation of stress) is incomplete and effect of suppression of chipping may not be exhibited.

The relative minimum point is observed at the first intermediate point in terms of a position (in FIG. 9, a point distant from the surface of the coated film by approximately 0.1 μm), and it is indicated that the compressive stress at the surface of the coated film (compressive stress having a value of approximately −5 GPa in FIG. 9) continuously decreases toward bottom surface 6 of the coated film and the degree of decrease changes at the relative minimum point. Here, change in the degree of decrease means that the compressive stress starts to continuously increase toward the second intermediate point on reaching the relative minimum point, as shown in FIG. 9.

In FIG. 9, the relative minimum point is present only at the first intermediate point, however, the embodiment of the present invention is not limited thereto, and encompasses also a case in which the relative minimum point is present with a certain thickness in the direction of thickness of the coated film. Here, the relative minimum point being present with a certain thickness refers to a case in which the compressive stress at the relative minimum point is maintained substantially constant from the first intermediate point across that thickness (preferably, not larger than ½ of the thickness of the coated film). As described above, the relative minimum point is present with a certain thickness from the first intermediate point, so that wear resistance can further be improved.

Therefore, the meaning of relative minimum point herein is identical to, or broader than, the meaning of a relative minimum point which is a term used in connection with a function in mathematics.

Meanwhile, as shown in FIG. 8, a second intermediate point 9 is located between first intermediate point 5 and bottom surface 6 of the coated film, however, second intermediate point 9 does not necessarily have to be located at a position at a distance from first intermediate point 5 comparable to ½ of the distance in the perpendicular direction from first intermediate point 5 to bottom surface 6 of the coated film.

Preferably, second intermediate point 9 is located at a position at a distance from the surface of the coated film comparable to at least 0.2% to at most 95% of the thickness of the coated film (distance in the perpendicular direction from surface 4 of the coated film to bottom surface 6 of the coated film). More preferably, the lower limit of that distance is set to 0.5% and further preferably to 1% of the thickness, while the upper limit thereof is suitably set to 90% and further preferably to 80% of the same. If the distance less than 0.2% of the thickness is set, decrease in the compressive stress is insufficient and improvement in resistance to film chipping and wear resistance may not be exhibited. In addition, if the distance larger than 95% of the thickness is set, an effect from application of large compressive stress inside the coated film is lowered and improvement in toughness may not be exhibited.

Preferably, the compressive stress at the second intermediate point is set to 50 to 200% of the compressive stress at the surface of the coated film. More preferably, the upper limit of the compressive stress at the second intermediate point is set to 180% and further preferably to 150% of the compressive stress at the surface, while the lower limit thereof is set to 60% and further preferably to 70% of the same.

If the compressive stress at the second intermediate point less than 50% of that at the surface is set, application of the compressive stress is insufficient and sufficient toughness may not be obtained. Meanwhile, if the compressive stress at the second intermediate point exceeds 200% of the compressive stress at the surface, application of the compressive stress is excessive and resistance to film chipping may be lowered.

The relative maximum point is observed at the second intermediate point in terms of a position (in FIG. 9, a point distant from the surface of the coated film by approximately 0.4 μm), and it is indicated that the compressive stress at first intermediate point 5 (compressive stress having a value of approximately −1.8 GPa in FIG. 9) continuously increases toward bottom surface 6 of the coated film and the degree of increase changes at the relative maximum point. Here, change in the degree of increase means that the compressive stress starts to continuously decrease toward bottom surface 6 of the coated film on reaching the relative maximum point, as shown in FIG. 9.

In FIG. 9, the relative maximum point is present only at the second intermediate point, however, the embodiment of the present invention is not limited thereto, and encompasses also a case in which the relative maximum point is present with a certain thickness in the direction of thickness of the coated film. Here, the relative maximum point being present with a certain thickness refers to a case in which the compressive stress at the relative maximum point is maintained substantially constant from the second intermediate point across that thickness (preferably, not larger than ½ of the thickness of the coated film). As described above, the relative maximum point is present with a certain thickness from the second intermediate point, so that toughness can further be improved.

Therefore, the meaning of relative maximum point herein is identical to, or broader than, the meaning of a relative maximum point which is a term used in connection with a function in mathematics.

Though FIG. 9 shows an embodiment in which the compressive stress continuously decreases from the second intermediate point toward the bottom surface of the coated film, the embodiment of the present invention is not limited thereto, and encompasses also a case in which the compressive stress is maintained constant (substantially constant) from the second intermediate point to the bottom surface of the coated film. When the compressive stress continuously decreases from the second intermediate point toward the bottom surface of the coated film, excellent wear resistance is attained. On the other hand, when the compressive stress maintains a constant value from the second intermediate point to the bottom surface of the coated film, toughness is further improved.

Figure 10:
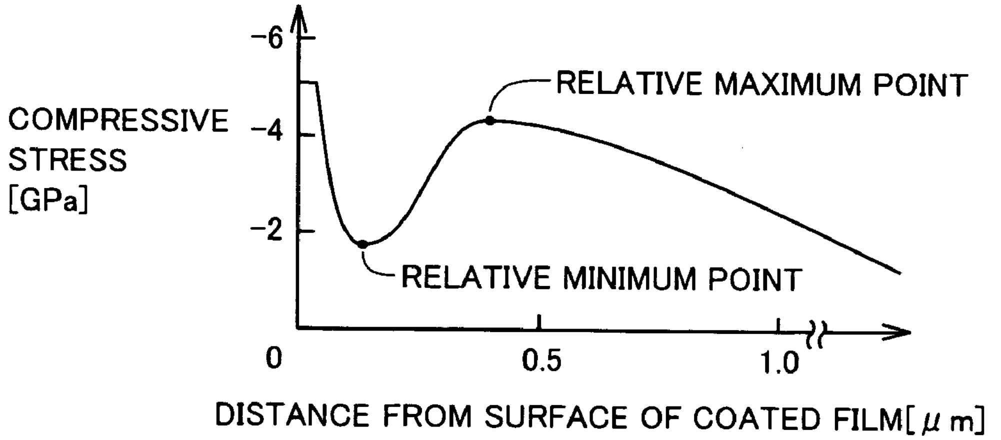
FIG. 10 is a graph showing the third embodiment of strength distribution of compressive stress of the coated film when compressive stress at the surface of the coated film is maintained across a prescribed distance.

In FIG. 9, the compressive stress continuously decreases from the surface of the coated film (that is, a point distant from the surface of the coated film by 0 μm), however, the embodiment of the present invention is not limited thereto. For example, as shown in FIG. 10, the present invention encompasses a case in which the compressive stress at the surface of the coated film is maintained toward the bottom surface of the coated film across a prescribed distance range (preferably not larger than 0.5 μm). In other words, the present invention includes an embodiment in which the compressive stress at the surface of the coated film is larger than in the inside (in other words, the absolute value of the compressive stress at the surface is larger than that in the inside), and the compressive stress is maintained across a prescribed distance from the surface of the coated film toward the first intermediate point (preferably not larger than 0.5 μm), and thereafter continuously decreases toward the first intermediate point.

As described above, when the compressive stress at the surface of the coated film is maintained across a prescribed distance range from the surface of the coated film toward the bottom surface of the coated film, particularly excellent toughness is attained, which is preferable.

The case that the compressive stress continuously decreases in the subject application encompasses not only a case in which the compressive stress decreases in a manner convex downward or convex upward as shown in FIG. 9 but also a case in which the compressive stress linearly decreases. In addition, provided that the compressive stress decreases as a whole, the case of continuous decrease in the subject application encompasses a case in which the compressive stress increases in a part, or a case in which the degree (slope) of decrease changes at some midpoint or the change is made in a stepped manner (decrease in the stepped manner).

The case that the compressive stress continuously increases in the subject application encompasses not only a case in which the compressive stress increases in a manner convex downward as shown in FIG. 9 but also a case in which the compressive stress increases in a manner convex upward or linearly increases. In addition, provided that the compressive stress increases as a whole, the case of continuous increase in the subject application encompasses a case in which the compressive stress decreases in a part, or a case in which the degree (slope) of increase changes at some midpoint or the change is made in a stepped manner (increase in the stepped manner).

As described above, according to the third embodiment of the strength distribution of the present invention, the compressive stress at the surface of the coated film continuously decreases from the surface of the coated film toward the first intermediate point located between the surface of the coated film and the bottom surface of the coated film and the compressive stress attains the relative minimum point at the first intermediate point. The compressive stress at the surface of the coated film is larger than that in the inside, so that occurrence of cracking on the surface of the coated film is suppressed as much as possible, self-destruction of the coated film due to large compressive stress at the surface of the coated film is prevented in the vicinity of the relative minimum point, and stress such as impact applied to the surface of the coated film is mitigated. Accordingly, pronounced effect of excellent toughness and resistance to film chipping as well as wear resistance is exhibited.

Moreover, according to the third embodiment of the strength distribution of the present invention, the compressive stress continuously increases from the first intermediate point toward the second intermediate point and attains the relative maximum point at the second intermediate point, so that further excellent toughness is provided. In this manner, the surface-coated cutting tool according to the present invention attains an extremely excellent effect in successfully achieving toughness, wear resistance and resistance to film chipping.

Such an excellent effect cannot be exhibited in the conventional surface-coated cutting tool (Patent Document 1) characterized in that there is no relative minimum point nor relative maximum point and that the compressive stress uniformly increases or decreases from the surface of the coated film toward the bottom surface of the coated film continuously or in a stepped manner.

Strength Distribution—Fourth Embodiment

The fourth embodiment of the strength distribution is characterized in that the compressive stress at the surface of the coated film continuously decreases from the surface of the coated film toward the first intermediate point located between the surface of the coated film and the bottom surface of the coated film and the compressive stress attains the relative minimum point at the first intermediate point, and that the compressive stress continuously increases from the first intermediate point toward the second intermediate point located between the first intermediate point and the bottom surface of the coated film and attains the relative maximum point at the second intermediate point, and the strength distribution has one or more similar relative minimum point between the second intermediate point and the bottom surface of the coated film.

Here, the similar relative minimum point refers to a point where the compressive stress exhibits a behavior on the strength distribution, the same as that at the relative minimum point represented as the first intermediate point, and, for example, refers to a point at which the degree of decrease in the compressive stress is changed after the compressive stress continuously decreases from the second intermediate point toward the bottom surface of the coated film. As described above, one or more relative minimum point is provided between the second intermediate point and the bottom surface of the coated film, so that development of cracking toward inside of the coated film that has occurred on the surface of the coated film can more effectively be suppressed, resistance to film chipping is further improved and excellent wear resistance is exhibited.

Meanwhile, the strength distribution may have one or more similar relative maximum point between the second intermediate point and the bottom surface of the coated film.

Here, the similar relative maximum point refers to a point where the compressive stress exhibits a behavior on the strength distribution, the same as that at the relative maximum point represented as the second intermediate point, and, for example, refers to a point at which the degree of increase in the compressive stress is changed after the compressive stress continuously increases from the relative minimum point located between the second intermediate point and the bottom surface of the coated film toward the bottom surface of the coated film. As described above, one or more relative maximum point is provided between the second intermediate point and the bottom surface of the coated film, so that further excellent toughness is exhibited and resistance to film chipping is also further improved.

The strength distribution may have one or more similar relative minimum point and one or more similar relative maximum point between the second intermediate point and the bottom surface of the coated film in an alternate and repeated manner in this order. Here, the number of times of repetition and an interval of repetition are not particularly limited. If the relative minimum points (including the relative minimum point at the first intermediate point) and the relative maximum points (including the relative maximum point at the second intermediate point) are present at substantially equal intervals, the number of times of repetition can be determined in connection with the thickness of the coated film, such that a distance between the relative minimum points and the distance between the relative maximum points are in a range from 0.1% to 70% of the thickness of the coated film, and such that the upper limit of the distance is preferably set to 60% and more preferably to 50% of the thickness, while the lower limit thereof is preferably set to 0.15% and more preferably to 0.2% of the thickness.

If the distance less than 0.1% of the thickness is set, the interval of repetition is too short to attain a stable stress state of the coated film, which results in likeliness of film chipping. Meanwhile, if the distance larger than 70% of the thickness is set, an effect of formation of a plurality of relative minimum points or relative maximum points may be lowered.

As described above, the plurality of relative minimum points and relative maximum points are present in an alternate and repeated manner in this order, so that the number of points where development energy of cracking that has occurred on the surface of the coated film can be absorbed is increased. Therefore, development of cracking toward inside of the coated film can more effectively be suppressed, resistance to film chipping is further improved, and further excellent wear resistance and toughness is exhibited.

Figure 11:
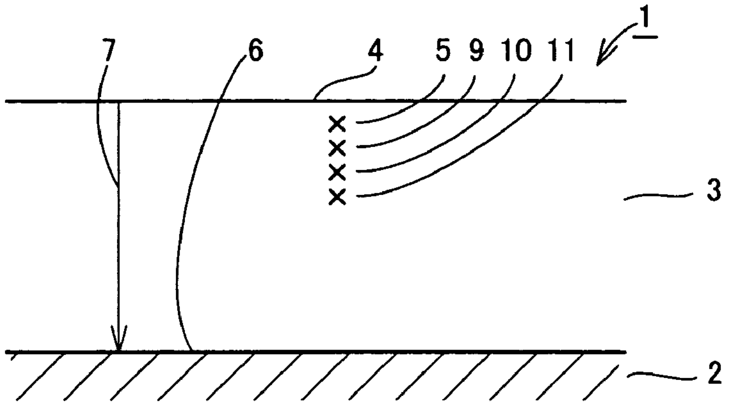
FIG. 11 is yet another enlarged schematic cross-sectional view of a portion in a coated film of the surface-coated cutting tool according to the present invention.
Figure 12:
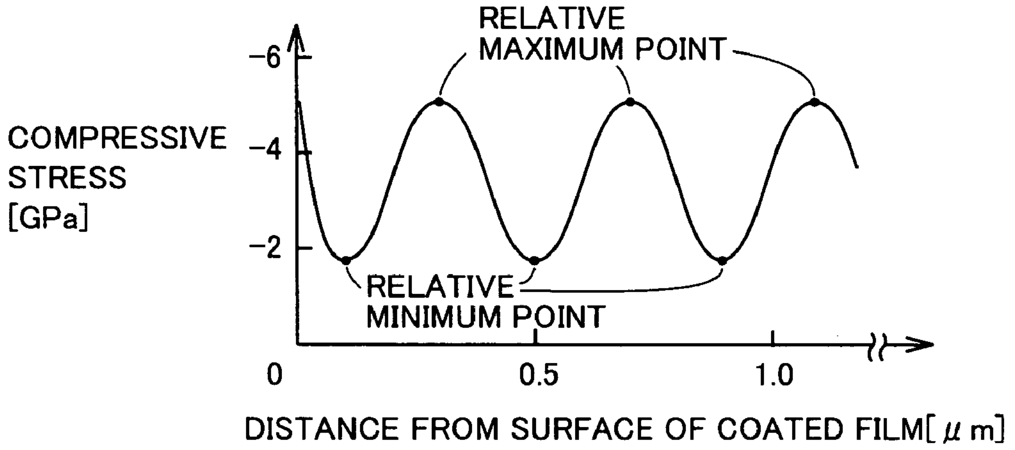
FIG. 12 is a graph showing a fourth embodiment of strength distribution of compressive stress of the coated film.

Various characteristics of the strength distribution described above will be discussed in detail with reference to FIG. 11 and FIG. 12 showing the fourth embodiment of the strength distribution of the present invention. FIG. 12 is a graph showing the strength distribution, in which the abscissa represents a distance from the surface of the coated film in the direction of thickness of the coated film and the ordinate represents the compressive stress.

Initially, as shown in FIG. 11, first intermediate point 5 is located between surface 4 of the coated film and bottom surface 6 of the coated film. With regard to a distance in a perpendicular direction from surface 4 of the coated film, first intermediate point 5 does not necessarily have to be located at a position at a distance from the surface comparable to ½ of the thickness of the coated film (distance in the perpendicular direction from surface 4 of the coated film to bottom surface 6 of the coated film). Normally, first intermediate point 5 is located closer to surface 4 of the coated film than to bottom surface 6 of the coated film.

Preferably, first intermediate point 5 is located at a position at a distance from surface 4 of the coated film comparable to at least 0.1% to at most 40% of the thickness of the coated film (distance in the perpendicular direction from surface 4 of the coated film to bottom surface 6 of the coated film). More preferably, the lower limit of that distance is set to 0.3% and further preferably to 0.5% of the thickness, while the upper limit thereof is suitably set to 35% and further preferably to 30% of the same. If the distance less than 0.1% of the thickness is set and when the tool is used in harsh heavy cutting such as interrupted cutting in which impact force is high, application of the compressive stress is incomplete and effect of suppression of chipping may not be obtained. In addition, if the distance larger than 40% of the thickness is set, an effect from reduction in the compressive stress inside the coated film is lowered and improvement in resistance to film chipping may not be exhibited.

In such strength distribution, the compressive stress may attain the maximum at surface 4 of the coated film (in other words, the compressive stress attains the largest absolute value). Accordingly, particularly excellent toughness can be obtained.

Preferably, the compressive stress at the first intermediate point is set to 10 to 80% of the compressive stress at the surface of the coated film. More preferably, the upper limit of the compressive stress at the first intermediate point is set to 70% and further preferably to 60% of the compressive stress at the surface, while the lower limit thereof is set to 15% and further preferably to 20% of the same. The relative minimum point second or later from the side of surface 4 of the coated film preferably has the compressive stress in the above-described range.

If the compressive stress at the first intermediate point less than 10% of that at the surface is set, sufficient toughness may not be obtained. Meanwhile, if the compressive stress at the first intermediate point exceeds 80% of the compressive stress at the surface, impact absorption (relaxation of stress) is incomplete and effect of suppression of film chipping may not be obtained.

A plurality of relative minimum points are present from surface 4 of the coated film toward bottom surface 6 of the coated film. As to the position, the first relative minimum point from the side of surface 4 of the coated film appears at the first intermediate point described above, and a relative minimum point is observed at any one or more point between second intermediate point 9 and bottom surface 6 of the coated film (for example, a third intermediate point 10 in FIG. 11). Here, such a relative minimum point refers to a point where the compressive stress exhibits such a behavior on the strength distribution that the degree of decrease in the compressive stress is changed after the compressive stress continuously decreases toward bottom surface 6 of the coated film. Here, change in the degree of decrease means that the compressive stress that has decreased toward bottom surface 6 of the coated film starts to continuously increase on reaching the relative minimum point.

Though FIG. 11 shows solely third intermediate point 10 as representing second or later relative minimum points, such representation is for the sake of convenience. The second or later relative minimum point is not limited as such.

In FIG. 12, the relative minimum point is present as a point not having a width in the direction of thickness of the coated film, however, the embodiment of the present invention is not limited thereto, and encompasses also a case in which the relative minimum point is present with a thickness (width) in the direction of thickness of the coated film. Here, the case that the relative minimum point is present with a certain thickness refers to a case in which the compressive stress at the relative minimum point maintains a substantially constant value across that thickness (preferably, not larger than ½ of the thickness of the coated film). As described above, the relative minimum point is present with a certain thickness, so that wear resistance can further be improved.

Therefore, the meaning of relative minimum point herein is identical to, or broader than, the meaning of a relative minimum point which is a term used in connection with a function in mathematics.

Meanwhile, as shown in FIG. 11, second intermediate point 9 is located between first intermediate point 5 and bottom surface 6 of the coated film, however, second intermediate point 9 does not necessarily have to be located at a position comparable to ½ of the distance in the perpendicular direction from first intermediate point 5 to bottom surface 6 of the coated film.

Preferably, second intermediate point 9 is located at a position at a distance from the surface of the coated film comparable to at least 0.2% to at most 80% of the thickness of the coated film (distance in the perpendicular direction from surface 4 of the coated film to bottom surface 6 of the coated film). More preferably, the lower limit of that distance is set to 0.5% and further preferably to 1% of the thickness, while the upper limit thereof is suitably set to 75% and further preferably to 70% of the same. If the distance less than 0.2% of the thickness is set, reduction in the compressive stress is incomplete and improvement in resistance to film chipping and wear resistance may not be exhibited. In addition, if the distance larger than 80% of the thickness is set, an effect from application of the large compressive stress inside the coated film is lowered and improvement in toughness may not be exhibited.

Preferably, the compressive stress at the second intermediate point is set to 50 to 200% of the compressive stress at the surface of the coated film. More preferably, the upper limit of the compressive stress at the second intermediate point is set to, 180% and further preferably to 150% of the compressive stress at the surface, while the lower limit thereof is set to 60% and further preferably to 70% of the same. If two or more relative maximum points are present, each relative maximum point preferably has the compressive stress in the above-described range.

If the compressive stress at the second intermediate point less than 50% of that at the surface is set, application of the compressive stress is insufficient and sufficient toughness may not be obtained. Meanwhile, if the compressive stress at the second intermediate point exceeds 200% of the compressive stress at the surface, application of the compressive stress is excessive and resistance to film chipping may be lowered.

One or more relative maximum point is present from surface 4 of the coated film toward bottom surface 6 of the coated film. As to the position, the first relative maximum point from the side of surface 4 of the coated film appears at second intermediate point 9 described above. If second or later relative maximum point is present, the relative maximum point is observed at any one or more point between second intermediate point 9 and bottom surface 6 of the coated film (for example, a fourth intermediate point 11 in FIG. 11). Such a relative maximum point refers to a point where the compressive stress exhibits such a behavior on the strength distribution that the degree of increase in the compressive stress is changed after the compressive stress continuously increases toward bottom surface 6 of the coated film. Here, change in the degree of increase means that the compressive stress that has increased toward bottom surface 6 of the coated film starts to continuously decrease on reaching the relative maximum point.

Though FIG. 11 shows solely fourth intermediate point 11 as representing second or later relative maximum point, such representation is for the sake of convenience. The second or later relative maximum point is not limited as such.

In FIG. 12, the relative maximum point is present as a point not having a width in the direction of thickness of the coated film, however, the embodiment of the present invention is not limited thereto, and encompasses also a case in which the relative maximum point is present with a thickness (width) in the direction of thickness of the coated film. Here, the case that the relative maximum point is present with a certain thickness refers to a case in which the compressive stress at the relative maximum point maintains a substantially constant value across that thickness (preferably, not larger than ½ of the thickness of the coated film). As described above, the relative maximum point is present with a certain thickness, so that toughness can further be improved.

Therefore, the meaning of relative maximum point herein is identical to, or broader than, the meaning of a relative maximum point which is a term used in connection with a function in mathematics.

The relative minimum points and the relative maximum points are preferably present between surface 4 of the coated film and bottom surface 6 of the coated film in an alternate and repeated manner in this order, as shown in FIG. 12. In addition, preferably, the relative minimum points and the relative maximum points are present at equal or unequal intervals, and the compressive stress is present as a substantially identical value at each relative minimum point or at each relative maximum point.

Figure 13:
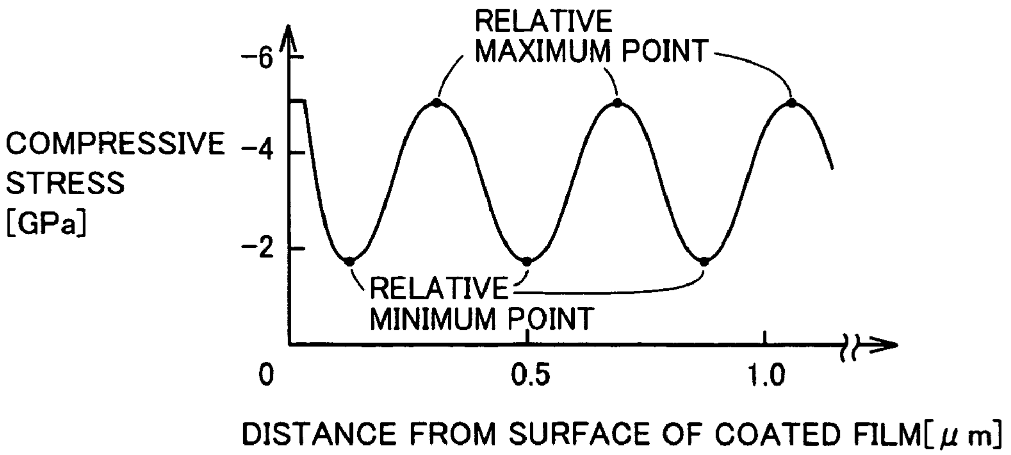
FIG. 13 is a graph showing the fourth embodiment of strength distribution of compressive stress of the coated film when compressive stress at the surface of the coated film is maintained across a prescribed distance.

In FIG. 12, the compressive stress continuously decreases from the surface of the coated film (that is, a point distant from the surface of the coated film by 0 μm), however, the embodiment of the present invention is not limited thereto. Namely, for example, as shown in FIG. 13, the present invention encompasses a case in which the compressive stress at the surface of the coated film is maintained toward the bottom surface of the coated film across a prescribed distance range (preferably not larger than 0.5 μm). In other words, the present invention includes an embodiment in which the compressive stress at the surface of the coated film is larger than in the inside (in other words, the absolute value of the compressive stress at the surface is larger than the absolute value thereof in the inside), and the compressive stress is maintained across a prescribed distance from the surface of the coated film toward the first intermediate point (preferably not larger than 0.5 μm) and thereafter continuously decreases toward the first intermediate point.

As described above, when the compressive stress at the surface of the coated film is maintained across a prescribed distance range from the surface of the coated film toward the bottom surface of the coated film, particularly excellent toughness is attained, which is preferable.

The case that the compressive stress continuously decreases in the subject application encompasses not only a case in which the compressive stress decreases in a manner convex downward or convex upward as shown in FIG. 12 but also a case in which the compressive stress linearly decreases. In addition, provided that the compressive stress decreases as a whole, the case of continuous decrease in the subject application encompasses a case in which the compressive stress increases in a part, or a case in which the degree (slope) of decrease changes at some midpoint or the change is made in a stepped manner (decrease in the stepped manner).

The case that the compressive stress continuously increases in the subject application encompasses not only a case in which the compressive stress increases in a manner convex downward as shown in FIG. 12 but also a case in which the compressive stress increases in a manner convex upward or linearly increases. In addition, provided that the compressive stress increases as a whole, the case of continuous increase in the subject application encompasses a case in which the compressive stress decreases in a part, or a case in which the degree (slope) of increase changes at some midpoint or the change is made in a stepped manner (increase in the stepped manner).

It is noted that, in the strength distribution described above, a point closest to bottom surface 6 of the coated film may be either the relative minimum point or the relative maximum point. Therefore, the compressive stress on bottom surface 6 of the coated film may be in increase or in decrease, or alternatively, the relative minimum point or the relative maximum point may coincide with bottom surface 6.

As described above, according to the fourth embodiment of the strength distribution of the present invention, the compressive stress at the surface of the coated film continuously decreases from the surface of the coated film toward the first intermediate point located between the surface of the coated film and the bottom surface of the coated film and the compressive stress attains the relative minimum point at the first intermediate point. The compressive stress at the surface of the coated film is larger than that in the inside, so that occurrence of cracking on the surface of the coated film is suppressed as much as possible, self-destruction of the coated film due to large compressive stress at the surface of the coated film is prevented in the vicinity of the relative minimum point, and stress such as impact applied to the surface of the coated film is mitigated. Accordingly, pronounced effect of excellent toughness and resistance to film chipping as well as excellent wear resistance is exhibited.

Moreover, according to the fourth embodiment of the strength distribution of the present invention, the compressive stress continuously increases from the first intermediate point toward the second intermediate point and attains the relative maximum point at the second intermediate point, so that further excellent toughness is provided. Furthermore, according to the fourth embodiment of the strength distribution of the present invention, a plurality of relative minimum points and relative maximum points are present between the second intermediate point and the bottom surface of the coated film in an alternate and repeated manner in this order. Therefore, development of cracking toward inside of the coated film that has occurred on the surface of the coated film can more effectively be suppressed, resistance to film chipping is further improved and further excellent wear resistance and toughness is exhibited.

In this manner, the surface-coated cutting tool according to the present invention attains an extremely excellent effect in successfully achieving toughness, wear resistance and resistance to film chipping.

Such an excellent effect cannot be exhibited in the conventional surface-coated cutting tool (Patent Document 1) characterized in that there is no relative minimum point nor relative maximum point and that the compressive stress uniformly increases or decreases from the surface of the coated film toward the bottom surface of the coated film continuously or in a stepped manner.

<Others>

Figure 5:
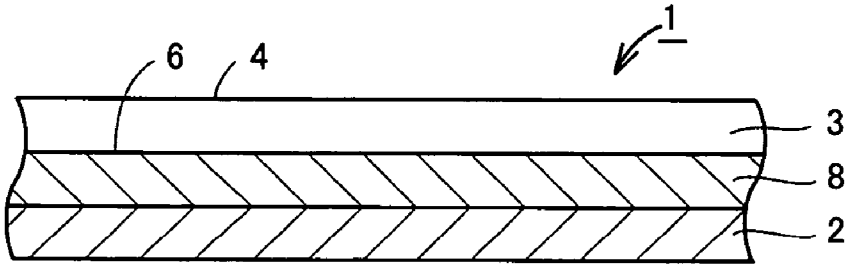
FIG. 5 is a schematic cross-sectional view of a surface-coated cutting tool according to the present invention having an intermediate layer formed.

In the surface-coated cutting tool according to the present invention, an arbitrary intermediate layer 8 may be formed between base material 2 and coated film 3 as shown in FIG. 5. Such intermediate layer 8 normally has a property to improve wear resistance or adhesion between the base material and the coated film, and may be implemented by a single layer or a plurality of layers. Here, bottom surface 6 of the coated film serves as a contact surface between coated film 3 and intermediate layer 8.

Such an intermediate layer may be composed, for example, of TiN, TiCN, TiSiN, TiAlN, AlCrN, AlVN, TiAlCrN, TiAlSiN, TiAlSiCrN, AlCrVN, or the like. In these compositions, a ratio of each atom follows an example of a general formula exemplified as the composition for the coated film.

EXAMPLE

In the following, the present invention will be described in detail with reference to examples, however, the present invention is not limited thereto. A compound composition of the coated film in the examples was confirmed by an XPS (X-ray photoelectron spectroscopic analyzer). In addition, the compressive stress and the thickness (or a distance from the surface of the coated film) were measured with the $\sin^2\psi$ method described above.

In measurement using the $\sin^2\psi$ method, energy of used X-ray was set to 10 keV, and diffraction peak was set to a (200) plane of $Ti_{0.5}Al_{0.5}N$ (Examples 1 to 6, Examples 11 to 16, Examples 21 to 26, and Examples 31 to 36), $Al_{0.7}Cr_{0.3}N$ (Examples 7 to 10), $Al_{0.6}Ti_{0.35}Cr_{0.05}N$ (Examples 17 to 20), $Al_{0.6}Ti_{0.3}SiO_{0.1}N$ (Examples 27 to 30), and $Al_{0.6}Ti_{0.2}SiO_{0.1}Cr_{0.1}N$ (Examples 37 to 40). Then, a measured diffraction peak position was determined by fitting of a Gauss function, and the slope of the $2\theta$-$\sin^2\psi$ diagram was found. In addition, a value found by using a dynamic hardness meter (Nanoindenter manufactured by MTS Systems Corporation) was adopted as the Young's modulus, and a value of TiN (0.19) was adopted as the Poisson's ratio. A stress value was thus set.

The coated film hereinafter was formed by using cathode arc ion plating, however, the film may be formed also by using balanced or unbalanced sputtering. In addition, though a coated film of a specific composition was formed hereinafter, a similar effect can be obtained also from a coated film of a different composition.

Examples 1 to 6

<Fabrication of Surface-Coated Cutting Tool>

Initially, as the base material for the surface-coated cutting tool, a throw away tip for cutting having a material and a tool shape (different depending on a method of evaluating each characteristic which will be described later) shown in Table 1 below was prepared, and the throw away tip (the base material) was attached to a cathode arc ion plating apparatus.

TABLE 1

| | Evaluation of Wear Resistance | | |
|---|---|---|---|
| | Continuous Cutting Test | Interrupted Cutting Test | Evaluation of Toughness |
| Base Material (JIS) | P20 | P20 | K20 |
| Shape of Tool | CNMG120408 | CNMG120408 | SDKN42M |
| Material to be Cut | SCM435 | SCM435 (4 grooves) | S50C Material with holes |
| Cutting Speed (m/min) | 350 | 320 | 180 |
| Feed (mm/rev) | 0.3 | 0.3 | — |
| Cutting (mm) | 2.0 | 1.5 | 2.0 |
| Oil for Cutting | Used | Used | Not Used |

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^{-4}$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Ti_{0.5}Al_{0.5}N$ is formed to a thickness of 3 μm as a coated film formed on the base material to be in direct contact therewith. Nitrogen gas serving as the reactive gas was introduced, the temperature of the base material (substrate) was set to 450° C., the reactive gas pressure was set to 4.0 Pa, and the substrate bias voltage was varied as shown in Table 2 below. In this manner, an arc current of 100A was supplied to the cathode electrode and metal ions were generated from an arc type evaporation source, whereby the surface-coated cutting tool according to the present invention of Examples 1 to 6 having strength distribution of the compressive stress shown in Table 3 below was fabricated.

TABLE 2

| No. | Substrate Bias Voltage/Elapsed Time | |
|---|---|---|
| Example 1 | Start to 40 minutes −50 V | 40 minutes to 60 minutes −50 V to −150 V |
| Example 2 | Start to 40 minutes −75 V | 40 minutes to 60 minutes −75 V to −150 V |
| Example 3 | Start to 40 minutes −100 V | 40 minutes to 60 minutes −100 V to −150 V |
| Example 4 | Start to 50 minutes −75 V | 50 minutes to 60 minutes −75 V to −150 V |
| Example 5 | Start to 58 minutes −75 V | 58 minutes to 60 minutes −75 V to −150 V |
| Example 6 | Start to 59 minutes −75 V | 59 minutes to 60 minutes −75 V to −150 V |

The time in Table 2 above shows an elapsed time since evaporation of the metal ions from the target made of alloy was started. In addition, a numeric value of the voltage in each field shows a substrate bias voltage set during the elapsed time described above. For example, if a single value such as "−50V" is shown, it indicates that the substrate bias voltage was constant during the elapsed time. Here, the compressive stress of the coated film also maintains a constant value. Meanwhile, if a range such as "−50V to −150V" is shown, it indicates that the substrate bias voltage was gradually increased from −50V to −150V at a constant speed during the elapsed time. Here, the compressive stress of the coated film gradually increases, and the relative minimum point of the compressive stress is formed at a point where the voltage starts to be raised.

The substrate bias voltage was varied or set to a constant value relative to the elapsed time, so that the relative minimum point or a section where the compressive stress maintains a constant value can be formed in the strength distribution of the compressive stress in the coated film.

TABLE 3

| No. | Compressive Stress at Surface | First Intermediate Point | Relative Minimum Point |
|---|---|---|---|
| Example 1 | −5.0 GPa | 43.3% (1.3 μm) | −1.8 GPa |
| Example 2 | −5.1 GPa | 43.3% (1.3 μm) | −3.0 GPa |
| Example 3 | −5.0 GPa | 43.3% (1.3 μm) | −4.0 GPa |
| Example 4 | −4.9 GPa | 16.7% (0.5 μm) | −3.0 GPa |
| Example 5 | −5.2 GPa | 3.3% (0.1 μm) | −3.2 GPa |
| Example 6 | −5.0 GPa | 1.0% (0.03 μm) | −2.9 GPa |

It is noted that a numeric value in a field of the compressive stress at the surface in Table 3 above shows the maximum compressive stress exhibited at the surface of the coated film. In addition, a numeric value in a field of the first intermediate point shows a distance in the direction of thickness of the coated film from the surface of the coated film to the first intermediate point (a numeric value shown with "%" is a value relative to the thickness of the coated film, accompanied by the indication with "μm"). Moreover, a numeric value in a field of the relative minimum point shows the compressive stress at that relative minimum point. This compressive stress is maintained constant toward the bottom surface of the coated film.

The surface-coated cutting tool according to the present invention in Examples 1 to 6 includes the base material and the coated film formed on the base material. The coated film serves as the outermost layer on the base material and has compressive stress. The compressive stress is varied so as to have strength distribution in a direction of thickness of the coated film, and the strength distribution is characterized in that the maximum compressive stress is attained at the surface of the coated film, and the compressive stress continuously decreases from the surface of the coated film toward the first intermediate point located between the surface of the coated film and the bottom surface of the coated film and attains the relative minimum point at the first intermediate point, and that the compressive stress maintains a constant value from the first intermediate point to the bottom surface of the coated film. That is, this strength distribution shows the strength distribution according to the first embodiment described above.

For the purpose of comparison, a surface-coated cutting tool was fabricated in a similar manner, except for a condition that the substrate bias voltage was uniformly raised from −20V to −150V taking 60 minutes, after evaporation of the metal ion from the target made of alloy is started (Comparative Example 1).

In the surface-coated cutting tool according to Comparative Example 1, the strength distribution of the compressive stress of the coated film had no relative minimum point and the compressive stress uniformly increased from the bottom surface of the coated film toward the surface of the coated film.

Examples 7 to 10

<Fabrication of Surface-Coated Cutting Tool>

Initially, a base material the same as that used in Examples 1 to 6 was employed as the base material for the surface-coated cutting tool, and this base material was attached to a cathode arc ion plating apparatus.

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^{-4}$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Al_{07}Cr_{0.3}N$ is formed to a thickness of 3 μm as a coated film formed on the base material to be in direct contact therewith. Nitrogen serving as the reactive gas was introduced, the temperature of the base material (substrate) was set to 450° C., the reactive gas pressure was set to 4.0 Pa, and the substrate bias voltage was varied as shown in Table 4 below. In this manner, an arc current of 100A was supplied to the cathode electrode and metal ions were generated from an arc type evaporation source, whereby the surface-coated cutting tool according to the present invention of Examples 7 to 10 having strength distribution of the compressive stress shown in Table 5 below was fabricated.

TABLE 4

| No. | Substrate Bias Voltage/Elapsed Time | |
|---|---|---|
| Example 7 | Start to 58 minutes<br>−50 V | 58 minutes to 60 minutes<br>−50 V to −200 V |
| Example 8 | Start to 58 minutes<br>−50 V | 58 minutes to 60 minutes<br>−50 V to −175 V |
| Example 9 | Start to 58 minutes | 58 minutes to 60 minutes |

TABLE 4-continued

| No. | Substrate Bias Voltage/Elapsed Time | |
|---|---|---|
| | −50 V | −50 V to −100 V |
| Example 10 | Start to 58 minutes<br>−50 V | 58 minutes to 60 minutes<br>−50 V to −75 V |

The time in Table 4 above, as in Table 2, shows an elapsed time since evaporation of the metal ions from the target made of alloy was started. In addition, a numeric value of the voltage in each field, as in Table 2, shows a substrate bias voltage set during the elapsed time described above.

TABLE 5

| No. | Compressive Stress at Surface | First Intermediate Point | Relative Minimum Point |
|---|---|---|---|
| Example 7 | −8.2 GPa | 3.3% (0.1 μm) | −1.8 GPa |
| Example 8 | −6.0 GPa | 3.3% (0.1 μm) | −2.0 GPa |
| Example 9 | −4.1 GPa | 3.3% (0.1 μm) | −2.1 GPa |
| Example 10 | −3.3 GPa | 3.3% (0.1 μm) | −2.2 GPa |

It is noted that a numeric value in a field of the compressive stress at the surface in Table 5 above, as in Table 3, shows the maximum compressive stress exhibited at the surface of the coated film. In addition, a numeric value in a field of the first intermediate point, as in Table 3, also shows a distance in the direction of thickness of the coated film from the surface of the coated film to the first intermediate point (a numeric value shown with "%" is a value relative to the thickness of the coated film, accompanied by the indication with "μm"). Moreover, a numeric value in a field of the relative minimum point, as in Table 3, also shows the compressive stress at that relative minimum point. This compressive stress maintains a constant value to the bottom surface of the coated film.

The surface-coated cutting tool according to the present invention in Examples 7 to 10 includes the base material and the coated film formed on the base material. The coated film serves as the outermost layer on the base material and has compressive stress. The compressive stress is varied so as to have strength distribution in a direction of thickness of the coated film, and the strength distribution is characterized in that the maximum compressive stress is attained at the surface of the coated film, the compressive stress continuously decreases from the surface of the coated film toward the first intermediate point located between the surface of the coated film and the bottom surface of the coated film and attains the relative minimum point at the first intermediate point, and that the compressive stress maintains a constant value from the first intermediate point to the bottom surface of the coated film. That is, this strength distribution shows the strength distribution according to the first embodiment described above.

For the purpose of comparison, a surface-coated cutting tool was fabricated in a similar manner, except for a condition that the substrate bias voltage was uniformly raised from −20V to −200V taking 60 minutes, after evaporation of the metal ion from the target made of alloy is started (Comparative Example 2).

In the surface-coated cutting tool according to Comparative Example 2, the strength distribution of the compressive stress of the coated film had no relative minimum point and the compressive stress uniformly increased from the bottom surface of the coated film toward the surface of the coated film.

<Evaluation of Wear-Resistance of Surface-Coated Cutting Tool>

Each of the surface-coated cutting tools according to Examples 1 to 10 and Comparative Examples 1 and 2 fabricated as above was subjected to a wet (water-soluble emulsion) continuous cutting test and a wet interrupted cutting test under the condition shown in Table 1 above. Then, the time at which a flank wear width at the cutting edge exceeds 0.2 mm was measured as the cutting time.

Tables 6 and 7 show a cutting time measured as described above as the result of evaluation of wear resistance of the surface-coated cutting tool. As the cutting time is longer, wear resistance is superior. In addition, in the continuous cutting test, shine on a finished surface of a material to be cut was also observed. Tables 6 and 7 also show a result of observation. Here, “shiny” indicates that the finished surface of the material to be cut had a shine, while “dim” indicates that the finished surface of the material to be cut had no shine but was dim.

As can clearly be seen from Tables 6 and 7, in both of the continuous cutting test and the interrupted cutting test, as compared with the surface-coated cutting tool in Comparative Examples 1 and 2, it was confirmed that the surface-coated cutting tool according to the present invention in Examples 1 to 10 attained further improved wear resistance, had a shine on the finished surface, and attained further improved life.

<Evaluation of Toughness of Surface-Coated Cutting Tool>

Each of the surface-coated cutting tools according to Examples 1 to 10 and Comparative Examples 1 and 2 fabricated as above was subjected to a test for evaluating toughness under the condition shown below.

As to the condition for cutting, specifically, as shown in Table 1 above, a block (300 mm length×150 mm width) including 50 through holes in an S50C material was used as a material to be cut. Dry milling cutting was performed under such a condition that a cutting speed was set to 180 m/min, a feed rate was increased from 0.10 mm/cutting edge by 0.05 mm/cutting edge, cutting was set to 2.0 mm, and the feed rate was increased for each length of cutting of 300 mm.

Tables 6 and 7 show the measured maximum feed as the result of evaluation of toughness of the surface-coated cutting tool. As the maximum feed rate is larger, toughness is superior.

As can clearly be seen from Tables 6 and 7, as compared with the surface-coated cutting tool in Comparative Examples 1 and 2, it was confirmed that the surface-coated cutting tool according to the present invention in Examples 1 to 10 attained further improved toughness.

TABLE 6

| | Evaluation of Wear Resistance | | |
|---|---|---|---|
| No. | Continuous Cutting Test | Interrupted Cutting Test | Evaluation of Toughness |
| Example 1 | 35 minutes (shiny) | 30 minutes | 0.5 mm/cutting edge |
| Example 2 | 39 minutes (shiny) | 33 minutes | 0.55 mm/cutting edge |
| Example 3 | 30 minutes (shiny) | 25 minutes | 0.5 mm/cutting edge |
| Example 4 | 43 minutes (shiny) | 37 minutes | 0.55 mm/cutting edge |

TABLE 6-continued

| | Evaluation of Wear Resistance | | |
|---|---|---|---|
| No. | Continuous Cutting Test | Interrupted Cutting Test | Evaluation of Toughness |
| Example 5 | 55 minutes (shiny) | 50 minutes | 0.65 mm/cutting edge |
| Example 6 | 48 minutes (shiny) | 42 minutes | 0.6 mm/cutting edge |
| Comparative Example 1 | 3 minutes (dim) | 10 seconds | 0.1 mm/cutting edge |

TABLE 7

| | Evaluation of Wear Resistance | | |
|---|---|---|---|
| No. | Continuous Cutting Test | Interrupted Cutting Test | Evaluation of Toughness |
| Example 7 | 30 minutes (shiny) | 23 minutes | 0.45 mm/cutting edge |
| Example 8 | 32 minutes (shiny) | 25 minutes | 0.50 mm/cutting edge |
| Example 9 | 34 minutes (shiny) | 28 minutes | 0.55 mm/cutting edge |
| Example 10 | 33 minutes (shiny) | 26 minutes | 0.55 mm/cutting edge |
| Comparative Example 2 | 3 minutes (dim) | 15 seconds | 0.1 mm/cutting edge |

Examples 11 to 16

<Fabrication of Surface-Coated Cutting Tool>

Initially, as the base material for the surface-coated cutting tool, a throw away tip for cutting having a material and a tool shape (different depending on a method of evaluating each characteristic which will be described later) shown in Table 1 above was prepared, and the throw away tip (the base material) was attached to a cathode arc ion plating apparatus.

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^{-4}$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Ti_{0.5}Al_{0.5}N$ is formed to a thickness of 3 μm as a coated film formed on the base material to be in direct contact therewith. Nitrogen gas serving as the reactive gas was introduced, the temperature of the base material (substrate) was set to 450° C., the reactive gas pressure was set to 4.0 Pa, and the substrate bias voltage was varied as shown in Table 8 below. In this manner, an arc current of 100A was supplied to the cathode electrode and metal ions were generated from an arc type evaporation source, whereby the surface-coated cutting tool according to the present invention of Examples 11 to 16 having strength distribution of the compressive stress shown in Table 9 below was fabricated.

TABLE 8

| No. | Substrate Bias Voltage/Elapsed Time | |
|---|---|---|
| Example 11 | Start to 40 minutes<br>−130 V to −50 V | 40 minutes to 60 minutes<br>−50 V to −160 V |
| Example 12 | Start to 40 minutes<br>−130 V to −75 V | 40 minutes to 60 minutes<br>−75 V to −160 V |
| Example 13 | Start to 40 minutes<br>−130 V to −100 V | 40 minutes to 60 minutes<br>−100 V to −160 V |
| Example 14 | Start to 50 minutes<br>−130 V to −75 V | 50 minutes to 60 minutes<br>−75 V to −160 V |
| Example 15 | Start to 58 minutes<br>−130 V to −75 V | 58 minutes to 60 minutes<br>−75 V to −160 V |
| Example 16 | Start to 59 minutes<br>−130 V to −75 V | 59 minutes to 60 minutes<br>−75 V to −160 V |

The time in Table 8 above shows an elapsed time since evaporation of the metal ions from the target made of alloy was started. In addition, a numeric value of the voltage in each field shows a substrate bias voltage set during the elapsed time described above. For example, if a range such as "−130V to −50V" is shown, it indicates that the substrate bias voltage was gradually decreased from −130V to −50V at a constant speed during the elapsed time. Here, the compressive stress of the coated film gradually decreases. Meanwhile, if a range such as "−50V to −160V" is shown, it indicates that the substrate bias voltage was gradually increased from −50V to −160V at a constant speed during the elapsed time. Here, the compressive stress of the coated film gradually increases, and the relative minimum point of the compressive stress is formed at a point where the voltage started to be raised.

The substrate bias voltage was varied relative to the elapsed time, so that the relative minimum point or continuous increase or decrease in the strength distribution of the compressive stress in the coated film can be formed.

TABLE 9

| No. | Compressive Stress at Surface | First Intermediate Point | Relative Minimum Point | Compressive Stress at Bottom Surface |
|---|---|---|---|---|
| Example 11 | −5.5 GPa | 33.3% (1.0 μm) | −2.0 GPa | −4.6 GPa |
| Example 12 | −5.6 GPa | 33.3% (1.0 μm) | −3.1 GPa | −4.5 GPa |
| Example 13 | −5.4 GPa | 36.7% (1.1 μm) | −4.0 GPa | −4.4 GPa |
| Example 14 | −5.5 GPa | 16.7% (0.5 μm) | −3.0 GPa | −4.5 GPa |
| Example 15 | −5.6 GPa | 3.3% (0.1 μm) | −3.1 GPa | −4.5 GPa |
| Example 16 | −5.5 GPa | 1.7% (0.05 μm) | −2.9 GPa | −4.6 GPa |

It is noted that numeric values in a field of the compressive stress at the surface and in a field of the compressive stress at the bottom surface in Table 9 above show compressive stresses exhibited at the surface of the coated film and at the bottom surface of the coated film respectively. In addition, a numeric value in a field of the first intermediate point shows a distance in the direction of thickness of the coated film from the surface of the coated film to the first intermediate point (a numeric value shown with "%" is a value relative to the thickness of the coated film, accompanied by the indication with "μm"). Moreover, a numeric value in a field of the relative minimum point shows the compressive stress at that relative minimum point.

The surface-coated cutting tool according to the present invention in Examples 11 to 16 includes the base material and the coated film formed on the base material. The coated film serves as the outermost layer on the base material and has compressive stress. The compressive stress is varied so as to have strength distribution in a direction of thickness of the coated film, and the strength distribution is characterized in that the compressive stress at the surface of the coated film continuously decreases from the surface of the coated film toward the first intermediate point located between the surface of the coated film and the bottom surface of the coated film and the compressive stress attains the relative minimum point at the first intermediate point, and that the compressive stress continuously increases from the first intermediate point toward the bottom surface of the coated film. That is, this strength distribution shows the strength distribution according to the second embodiment described above.

For the purpose of comparison, a surface-coated cutting tool was fabricated in a similar manner, except for a condition that the substrate bias voltage was uniformly raised from −20V to −150V taking 60 minutes, after evaporation of the metal ion from the target made of alloy is started (Comparative Example 3).

In the surface-coated cutting tool according to Comparative Example 3, the strength distribution of the compressive stress of the coated film had no relative minimum point and the compressive stress uniformly increased from the bottom surface of the coated film toward the surface of the coated film.

Examples 17 to 20

<Fabrication of Surface-Coated Cutting Tool>

Initially, a base material the same as that used in Examples 11 to 16 was employed as the base material for the surface-coated cutting tool, and this base material was attached to a cathode arc ion plating apparatus.

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^{-4}$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Al_{0.6}Ti_{0.35}Cr_{0.15}N$ is formed to a thickness of 3 μm as a coated film formed on the base material to be in direct contact therewith. Nitrogen serving as the reactive gas was introduced, the temperature of the base material (substrate) was set to 450° C. and the reactive gas pressure was set to 4.0 Pa, and the substrate bias voltage was varied as shown in Table 10 below. In this manner, an arc current of 100A was supplied to the cathode electrode and metal ions were generated from an arc type evaporation source, whereby the surface-coated cutting tool according to the present invention of Examples 17 to 20 having strength distribution of the compressive stress shown in Table 11 below was fabricated.

TABLE 10

| No. | Substrate Bias Voltage/Elapsed Time | |
|---|---|---|
| Example 17 | Start to 58 minutes<br>−140 V to −80 V | 58 minutes to 60 minutes<br>−80 V to −260 V |
| Example 18 | Start to 58 minutes<br>−140 V to −80 V | 58 minutes to 60 minutes<br>−80 V to −240 V |

TABLE 10-continued

| No. | Substrate Bias Voltage/Elapsed Time | |
|---|---|---|
| Example 19 | Start to 58 minutes −140 V to −80 V | 58 minutes to 60 minutes −80 V to −140 V |
| Example 20 | Start to 58 minutes −140 V to −80 V | 58 minutes to 60 minutes −80 V to −95 V |

The time in Table 10 above, as in Table 8, shows an elapsed time since evaporation of the metal ions from the target made of alloy was started. In addition, a numeric value of the voltage in each field, as in Table 8, shows a substrate bias voltage set during the elapsed time described above.

TABLE 11

| No. | Compressive Stress at Surface | First Intermediate Point | Relative Minimum Point | Compressive Stress at Bottom Surface |
|---|---|---|---|---|
| Example 17 | −8.0 GPa | 3.3% (0.1 μm) | −3.0 GPa | −4.5 GPa |
| Example 18 | −6.8 GPa | 3.3% (0.1 μm) | −3.1 GPa | −4.3 GPa |
| Example 19 | −4.6 GPa | 3.3% (0.1 μm) | −3.2 GPa | −4.4 GPa |
| Example 20 | −3.5 GPa | 3.3% (0.1 μm) | −3.0 GPa | −4.3 GPa |

It is noted that numeric values in a field of the compressive stress at the surface and in a field of the compressive stress at the bottom surface in Table 11 above, as in Table 9, show compressive stresses exhibited at the surface of the coated film and at the bottom surface of the coated film respectively. In addition, a numeric value in a field of the first intermediate point, as in Table 9, also shows a distance in the direction of thickness of the coated film from the surface of the coated film to the first intermediate point (a numeric value shown with "%" is a value relative to the thickness of the coated film, accompanied by the indication with "μm"). Moreover, a numeric value in a field of the relative minimum point, as in Table 9, also shows the compressive stress at that relative minimum point.

The surface-coated cutting tool according to the present invention in Examples 17 to 20 includes the base material and the coated film formed on the base material. The coated film serves as the outermost layer on the base material and has compressive stress. The compressive stress is varied so as to have strength distribution in a direction of thickness of the coated film, and the strength distribution is characterized in that the compressive stress at the surface of the coated film continuously decreases from the surface of the coated film toward the first intermediate point located between the surface of the coated film and the bottom surface of the coated film and the compressive stress attains the relative minimum point at the first intermediate point, and that the compressive stress continuously increases from the first intermediate point toward the bottom surface of the coated film. That is, this strength distribution shows the strength distribution according to the second embodiment described above.

For the purpose of comparison, a surface-coated cutting tool was fabricated in a similar manner, except for a condition that the substrate bias voltage was maintained at −75V for 60 minutes, after evaporation of the metal ion from the target made of alloy is started (Comparative Example 4).

In the surface-coated cutting tool according to Comparative Example 4, there was no strength distribution of the compressive stress of the coated film and the compressive stress was constant from the bottom surface of the coated film to the surface of the coated film.

<Evaluation of Wear-Resistance of Surface-Coated Cutting Tool>

Each of the surface-coated cutting tools according to Examples 11 to 20 and Comparative Examples 3 and 4 fabricated as above was subjected to a wet (water-soluble emulsion) continuous cutting test and a wet interrupted cutting test under the condition shown in Table 1 above. Then, the time at which a flank wear width at the cutting edge exceeds 0.2 mm was measured as the cutting time.

Tables 12 and 13 show the cutting time measured as described above as the result of evaluation of wear resistance of the surface-coated cutting tool. As the cutting time is longer, wear resistance is superior. In addition, in the continuous cutting test, shine on a finished surface of a material to be cut was also observed. Tables 12 and 13 also show the result of observation. Here, "shiny" indicates that the finished surface of the material to be cut had a shine, while "dim" indicates that the finished surface of the material to be cut had no shine but was dim.

As can clearly be seen from Tables 12 and 13, in both of the continuous cutting test and the interrupted cutting test, as compared with the surface-coated cutting tool in Comparative Examples 3 and 4, it was confirmed that the surface-coated cutting tool according to the present invention in Examples 11 to 20 attained further improved wear resistance, had a shine on the finished surface, and attained excellent resistance to film chipping and further improved life.

<Evaluation of Toughness of Surface-Coated Cutting Tool>

Each of the surface-coated cutting tools according to Examples 11 to 20 and Comparative Examples 3 and 4 fabricated as above was subjected to a test for evaluating toughness under the condition shown below.

As to the condition for cutting, specifically, as shown in Table 1 above, a block (300 mm length×150 mm width) including 50 through holes in an S50C material was used as a material to be cut. Dry milling cutting was performed under such a condition that a cutting speed was set to 180 m/min, cutting was set to 2.0 mm, and a feed rate was increased from 0.10 mm/cutting edge by 0.05 mm/cutting edge for each length of cutting of 300 mm.

Tables 12 and 13 show the measured maximum feed as the result of evaluation of toughness of the surface-coated cutting tool. As the maximum feed rate is larger, toughness is superior.

As can clearly be seen from Tables 12 and 13, as compared with the surface-coated cutting tool in Comparative Examples 3 and 4, it was confirmed that the surface-coated cutting tool according to the present invention in Examples 11 to 20 attained further improved toughness.

TABLE 12

| No. | Evaluation of Wear Resistance | | Evaluation of Toughness |
|---|---|---|---|
| | Continuous Cutting Test | Interrupted Cutting Test | |
| Example 11 | 34 minutes (shiny) | 34 minutes | 0.6 mm/cutting edge |
| Example 12 | 37 minutes (shiny) | 36 minutes | 0.6 mm/cutting edge |
| Example 13 | 29 minutes (shiny) | 34 minutes | 0.6 mm/cutting edge |
| Example 14 | 41 minutes (shiny) | 41 minutes | 0.65 mm/cutting edge |
| Example 15 | 51 minutes (shiny) | 53 minutes | 0.7 mm/cutting edge |
| Example 16 | 45 minutes (shiny) | 45 minutes | 0.65 mm/cutting edge |
| Comparative Example 3 | 3 minutes (dim) | 10 seconds | 0.1 mm/cutting edge |

TABLE 13

| No. | Evaluation of Wear Resistance: Continuous Cutting Test | Evaluation of Wear Resistance: Interrupted Cutting Test | Evaluation of Toughness |
|---|---|---|---|
| Example 17 | 47 minutes (shiny) | 62 minutes | 0.8 mm/cutting edge |
| Example 18 | 49 minutes (shiny) | 57 minutes | 0.75 mm/cutting edge |
| Example 19 | 52 minutes (shiny) | 41 minutes | 0.65 mm/cutting edge |
| Example 20 | 54 minutes (shiny) | 30 minutes | 0.5 mm/cutting edge |
| Comparative Example 4 | 2 minutes (dim) | 5 seconds | Chipping at initial stage, at 0.1 mm/cutting edge |

Examples 21 to 26

<Fabrication of Surface-Coated Cutting Tool>

Initially, as the base material for the surface-coated cutting tool, a throw away tip for cutting having a material and a tool shape (different depending on a method of evaluating each characteristic which will be described later) shown in Table 1 above was prepared, and the throw away tip (the base material) was attached to a cathode arc ion plating apparatus.

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^{-4}$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Ti_{0.5}Al_{0.5}N$ is formed to a thickness of 3 μm as a coated film formed on the base material to be in direct contact therewith. Nitrogen gas serving as the reactive gas was introduced, the temperature of the base material (substrate) was set to 450° C., the reactive gas pressure was set to 4.0 Pa, and the substrate bias voltage was varied as shown in Table 14 below. In this manner, an arc current of 100A was supplied to the cathode electrode and metal ions were generated from an arc type evaporation source, whereby the surface-coated cutting tool according to the present invention of Examples 21 to 26 having strength distribution of the compressive stress shown in Table 15 below was fabricated.

TABLE 14

| No. | Substrate Bias Voltage/Elapsed Time | | |
|---|---|---|---|
| Example 21 | Start to 30 minutes | 30 minutes to 40 minutes | 40 minutes to 60 minutes |
| | −30 V to −130 V | −130 V to −50 V | −50 V to −160 V |
| Example 22 | Start to 30 minutes | 30 minutes to 40 minutes | 40 minutes to 60 minutes |
| | −30 V to −130 V | −130 V to −75 V | −75 V to −160 V |
| Example 23 | Start to 30 minutes | 30 minutes to 40 minutes | 40 minutes to 60 minutes |
| | −30 V to −130 V | −130 V to −100 V | −100 V to −160 V |
| Example 24 | Start to 30 minutes | 30 minutes to 50 minutes | 50 minutes to 60 minutes |
| | −30 V to −130 V | −130 V to −75 V | −75 V to −160 V |
| Example 25 | Start to 30 minutes | 30 minutes to 58 minutes | 58 minutes to 60 minutes |
| | −30 V to −130 V | −130 V to −75 V | −75 V to −160 V |
| Example 26 | Start to 30 minutes | 30 minutes to 59 minutes | 59 minutes to 60 minutes |
| | −30 V to −130 V | −130 V to −75 V | −75 V to −160 V |

The time in Table 14 above shows an elapsed time since evaporation of the metal ions from the target made of alloy was started. In addition, a numeric value of the voltage in each field shows a substrate bias voltage set during the elapsed time described above. For example, if a range such as "−30V to −130V" is shown, it indicates that the substrate bias voltage was gradually increased from −30V to −130V at a constant speed during the elapsed time. Here, the compressive stress of the coated film gradually increases. Meanwhile, if a range such as "−130V to −50V" is shown, it indicates that the substrate bias voltage was gradually decreased from −130V to −50V at a constant speed during the elapsed time. Here, the compressive stress of the coated film gradually decreases. The relative maximum point and the relative minimum point of the compressive stress are formed at a point where the increase in the voltage turns to decrease and at a point where the decrease in the voltage turns to increase, respectively.

The substrate bias voltage was varied relative to the elapsed time, so that the relative maximum point and the relative minimum point or continuous increase or decrease in the strength distribution of the compressive stress in the coated film can be formed.

face of the coated film and the bottom surface of the coated film and the compressive stress attains the relative minimum point at the first intermediate point, and that the compressive stress continuously increases from the first intermediate point toward the second intermediate point located between the first intermediate point and the bottom surface of the coated film, attains the relative maximum point at the second intermediate point, and continuously decreases from the second intermediate point toward the bottom surface of the coated film. That is, this strength distribution shows the strength distribution according to the third embodiment described above.

For the purpose of comparison, a surface-coated cutting tool was fabricated in a similar manner, except for a condition that the substrate bias voltage was uniformly raised from −20V to −150V taking 60 minutes, after evaporation of the metal ion from the target made of alloy is started (Comparative Example 5).

In the surface-coated cutting tool according to Comparative Example 5, the strength distribution of the compressive stress of the coated film had no relative minimum point nor relative maximum point and the compressive stress uniformly increased from the bottom surface of the coated film toward the surface of the coated film.

TABLE 15

| No. | Compressive Stress at Surface | First Intermediate Point | Relative Minimum Point | Second Intermediate Point | Relative Maximum Point | Compressive Stress at Bottom Surface |
|---|---|---|---|---|---|---|
| Example 21 | −5.4 GPa | 36.7% (1.1 μm) | −2.1 GPa | 50.0% (1.5 μm) | −4.5 GPa | −0.9 GPa |
| Example 22 | −5.6 GPa | 33.3% (1.0 μm) | −3.0 GPa | 50.0% (1.5 μm) | −4.6 GPa | −1.0 GPa |
| Example 23 | −5.5 GPa | 33.3% (1.0 μm) | −4.1 GPa | 53.3% (1.6 μm) | −4.5 GPa | −1.0 GPa |
| Example 24 | −5.5 GPa | 16.7% (0.5 μm) | −3.0 GPa | 50.0% (1.5 μm) | −4.4 GPa | −1.1 GPa |
| Example 25 | −5.6 GPa | 3.3% (0.1 μm) | −3.0 GPa | 46.7% (1.4 μm) | −4.5 GPa | −1.0 GPa |
| Example 26 | −5.5 GPa | 1.7% (0.05 μm) | −3.1 GPa | 50.0% (1.5 μm) | −4.5 GPa | −0.9 GPa |

It is noted that numeric values in a field of the compressive stress at the surface and in a field of the compressive stress at the bottom surface in Table 15 above show compressive stresses exhibited at the surface of the coated film and at the bottom surface of the coated film respectively. In addition, numeric values in a field of the first intermediate point and in a field of the second intermediate point show distances in the direction of thickness of the coated film from the surface of the coated film to the first intermediate point and to the second intermediate point respectively (a numeric value shown with "%" is a value relative to the thickness of the coated film, accompanied by the indication with "μm"). Moreover, numeric values in a field of the relative minimum point and in a field of the relative maximum point show the compressive stresses at that relative minimum point and relative maximum point respectively.

The surface-coated cutting tool according to the present invention in Examples 21 to 26 includes the base material and the coated film formed on the base material. The coated film serves as the outermost layer on the base material and has compressive stress. The compressive stress is varied so as to have strength distribution in a direction of thickness of the coated film, and the strength distribution is characterized in that the compressive stress at the surface of the coated film continuously decreases from the surface of the coated film toward the first intermediate point located between the sur-

Examples 27 to 30

<Fabrication of Surface-Coated Cutting Tool>

Initially, a base material the same as that used in Examples 21 to 26 was employed as the base material for the surface-coated cutting tool, and this base material was attached to a cathode arc ion plating apparatus.

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^{-4}$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Al_{0.6}Ti_{0.3}Si_{0.1}N$ is formed to a thickness of 3 μm as a coated film formed on the base material to be in direct contact therewith. Nitrogen serving as the reactive gas was introduced, the temperature of the base material (substrate) was set to 450° C., the reactive gas pressure was set to 4.0 Pa, and the substrate bias voltage was varied as shown in Table 16 below. In this manner, an arc current of 100A was supplied to the cathode electrode and metal ions were generated from an arc type evaporation source, whereby the surface-coated cutting tool according to the present invention of Examples 27 to 30 having strength distribution of the compressive stress shown in Table 17 below was fabricated.

TABLE 16

| No. | Substrate Bias Voltage/Elapsed Time | | |
|---|---|---|---|
| Example 27 | Start to 30 minutes −30 V to −100 V | 30 minutes to 58 minutes −100 V to −75 V | 58 minutes to 60 minutes −75 V to −160 V |
| Example 28 | Start to 30 minutes −30 V to −160 V | 30 minutes to 58 minutes −160 V to −75 V | 58 minutes to 60 minutes −75 V to −160 V |
| Example 29 | Start to 30 minutes −30 V to −230 V | 30 minutes to 58 minutes −230 V to −75 V | 58 minutes to 60 minutes −75 V to −160 V |
| Example 30 | Start to 30 minutes −30 V to −260 V | 30 minutes to 58 minutes −260 V to −75 V | 58 minutes to 60 minutes −75 V to −160 V |

The time in Table 16 above, as in Table 14, shows an elapsed time since evaporation of the metal ions from the target made of alloy was started. In addition, a numeric value of the voltage in each field, as in Table 14, shows a substrate bias voltage set during the elapsed time described above.

TABLE 17

| No. | Compressive Stress at Surface | First Intermediate Point | Relative Minimum Point | Second Intermediate Point | Relative Maximum Point | Compressive Stress at Bottom Surface |
|---|---|---|---|---|---|---|
| Example 27 | −5.5 GPa | 3.3% (0.1 μm) | −3.1 GPa | 50.0% (1.5 μm) | −4.0 GPa | −1.0 GPa |
| Example 28 | −5.5 GPa | 3.3% (0.1 μm) | −3.0 GPa | 46.7% (1.4 μm) | −5.5 GPa | −1.0 GPa |
| Example 29 | −5.4 GPa | 3.3% (0.1 μm) | −3.0 GPa | 50.0% (1.5 μm) | −6.5 GPa | −0.9 GPa |
| Example 30 | −5.6 GPa | 3.3% (0.1 μm) | −3.2 GPa | 53.3% (1.6 μm) | −8.0 GPa | −1.0 GPa |

It is noted that numeric values in a field of the compressive stress at the surface and in a field of the compressive stress at the bottom surface in Table 17 above, as in Table 15, show compressive stresses exhibited at the surface of the coated film and at the bottom surface of the coated film respectively. In addition, numeric values in a field of the first intermediate point and in a field of the second intermediate point, as in Table 15, also show distances in the direction of thickness of the coated film from the surface of the coated film to respective intermediate points (a numeric value shown with "%" is a value relative to the thickness of the coated film, accompanied by the indication with "μm"). Moreover, numeric values in a field of the relative minimum point and in a field of the relative maximum point, as in Table 15, also show compressive stresses at those points respectively.

The surface-coated cutting tool according to the present invention in Examples 27 to 30 includes the base material and the coated film formed on the base material. The coated film serves as the outermost layer on the base material and has compressive stress. The compressive stress is varied so as to have strength distribution in a direction of thickness of the coated film, and the strength distribution is characterized in that the compressive stress at the surface of the coated film continuously decreases from the surface of the coated film toward the first intermediate point located between the surface of the coated film and the bottom surface of the coated film and attains the relative minimum point at the first intermediate point, and that the compressive stress continuously increases from the first intermediate point toward the second intermediate point located between the first intermediate point and the bottom surface of the coated film, attains the relative maximum point at the second intermediate point, and continuously decreases from the second intermediate point toward the bottom surface of the coated film. That is, this strength distribution shows the strength distribution according to the third embodiment described above.

For the purpose of comparison, a surface-coated cutting tool was fabricated in a similar manner, except for a condition that the substrate bias voltage was maintained at −75V for 60 minutes, after evaporation of the metal ion from the target made of alloy is started (Comparative Example 6).

In the surface-coated cutting tool according to Comparative Example 6, there was no strength distribution of the compressive stress of the coated film and the compressive stress was constant from the bottom surface of the coated film to the surface of the coated film.

<Evaluation of Wear-Resistance of Surface-Coated Cutting Tool>

Each of the surface-coated cutting tools according to Examples 21 to 30 and Comparative Examples 5 and 6 fabricated as above was subjected to a wet (water-soluble emulsion) continuous cutting test and a wet interrupted cutting test under the condition shown in Table 1 above. Then, the time at which a flank wear width at the cutting edge exceeds 0.2 mm was measured as the cutting time.

Tables 18 and 19 show the cutting time measured as described above as the result of evaluation of wear resistance of the surface-coated cutting tool. As the cutting time is longer, wear resistance is superior. In addition, in the continuous cutting test, shine on a finished surface of a material to be cut was also observed. Tables 18 and 19 also show the result of observation. Here, "shiny" indicates that the finished surface of the material to be cut had a shine, while "dim" indicates that the finished surface of the material to be cut had no shine but was dim.

As can clearly be seen from Tables 18 and 19, in both of the continuous cutting test and the interrupted cutting test, as compared with the surface-coated cutting tool in Comparative Examples 5 and 6, it was confirmed that the surface-coated cutting tool according to the present invention in Examples 21 to 30 attained further improved wear resistance, had a shine on the finished surface, and attained excellent resistance to film chipping and further improved life.

<Evaluation of Toughness of Surface-Coated Cutting Tool>

Each of the surface-coated cutting tools according to Examples 21 to 30 and Comparative Examples 5 and 6 fabricated as above was subjected to a test for evaluating toughness under the condition shown below.

As to the condition for cutting, specifically, as shown in Table 1 above, a block (300 mm length×150 mm width) including 50 through holes in an S50C material was used as a material to be cut. Dry milling cutting was performed under such a condition that a cutting speed was set to 180 m/min, cutting was set to 2.0 mm, and a feed rate was increased from 0.10 mm/cutting edge by 0.05 mm/cutting edge for each length of cutting of 300 mm.

Tables 18 and 19 show the measured maximum feed as the result of evaluation of toughness of the surface-coated cutting tool. As the maximum feed rate is larger, toughness is superior.

As can clearly be seen from Tables 18 and 19, as compared with the surface-coated cutting tool in Comparative Examples 5 and 6, it was confirmed that the surface-coated cutting tool according to the present invention in Examples 21 to 30 attained further improved toughness.

TABLE 18

| No. | Evaluation of Wear Resistance: Continuous Cutting Test | Evaluation of Wear Resistance: Interrupted Cutting Test | Evaluation of Toughness |
|---|---|---|---|
| Example 21 | 45 minutes (shiny) | 35 minutes | 0.6 mm/cutting edge |
| Example 22 | 48 minutes (shiny) | 38 minutes | 0.65 mm/cutting edge |
| Example 23 | 30 minutes (shiny) | 36 minutes | 0.6 mm/cutting edge |
| Example 24 | 40 minutes (shiny) | 43 minutes | 0.7 mm/cutting edge |
| Example 25 | 62 minutes (shiny) | 55 minutes | 0.75 mm/cutting edge |
| Example 26 | 55 minutes (shiny) | 45 minutes | 0.7 mm/cutting edge |
| Comparative Example 5 | 3 minutes (dim) | 10 seconds | 0.1 mm/cutting edge |

TABLE 19

| No. | Evaluation of Wear Resistance: Continuous Cutting Test | Evaluation of Wear Resistance: Interrupted Cutting Test | Evaluation of Toughness |
|---|---|---|---|
| Example 27 | 60 minutes (shiny) | 54 minutes | 0.7 mm/cutting edge |
| Example 28 | 62 minutes (shiny) | 59 minutes | 0.8 mm/cutting edge |
| Example 29 | 59 minutes (shiny) | 61 minutes | 0.8 mm/cutting edge |
| Example 30 | 57 minutes (shiny) | 64 minutes | 0.85 mm/cutting edge |
| Comparative Example 6 | 15 minutes (dim) | 5 seconds | Chipping at initial stage, at 0.1 mm/cutting edge |

Examples 31 to 36

<Fabrication of Surface-Coated Cutting Tool>

Initially, as the base material for the surface-coated cutting tool, a throw away tip for cutting having a material and a tool shape (different depending on a method of evaluating each characteristic which will be described later) shown in Table 1 above was prepared, and the throw away tip (the base material) was attached to a cathode arc ion plating apparatus.

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^{-4}$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Ti_{0.5}A_{0.5}N$ is formed to a thickness of 3 μm as a coated film formed on the base material to be in direct contact therewith. Nitrogen gas serving as the reactive gas was introduced, the temperature of the base material (substrate) was set to 450° C., the reactive gas pressure was set to 4.0 Pa, and the substrate bias voltage was varied as shown in Table 20 below. In this manner, an arc current of 100A was supplied to the cathode electrode for 60 minutes and metal ions were generated from an arc type evaporation source, whereby the surface-coated cutting tool according to the present invention of Examples 31 to 36 having strength distribution of the compressive stress shown in Table 21 below was fabricated.

TABLE 20

| No. | First Cycle (Time/Substrate Bias Voltage) | Second Cycle (Time/Substrate Bias Voltage) |
|---|---|---|
| Example 31 | 15 minutes<br>−150 V to −50 V | 15 minutes<br>−50 V to −150 V |
| Example 32 | 5 minutes<br>−150 V to −50 V | 5 minutes<br>−50 V to −150 V |
| Example 33 | 1 minute<br>−150 V to −50 V | 1 minute<br>−50 V to −150 V |
| Example 34 | 1 minute<br>−150 V to −50 V | 2 minutes<br>−50 V to −150 V |
| Example 35 | 12 minutes<br>−20 V to −210 V | 12 minutes<br>−210 V to −20 V |
| Example 36 | 12 minutes<br>−75 V to −150 V | 12 minutes<br>−150 V to −75 V |

The "first cycle" and the "second cycle" in Table 20 above indicate that the substrate bias voltage is applied as a result of alternately repeating, for 60 minutes, these cycles lasting for the time period shown in the fields of the first and second cycles (the cycle starts from the "first cycle", however, it is not necessary to end with the "second cycle"). That is, the time shown in each field of cycle shows the elapsed time during which the metal ion evaporates from the target made of alloy. A numeric value of the voltage in each field shows a substrate bias voltage set during the elapsed time described above. For example, if a range such as "−150V to −50V" is shown, it indicates that the substrate bias voltage was gradually decreased from −150V to −50V at a constant speed during the elapsed time. Here, the compressive stress of the coated film gradually decreases. Meanwhile, if a range such as "−50V to –150V" is shown, it indicates that the substrate bias voltage was gradually increased from –50V to –150V at a constant speed during the elapsed time. Here, the compressive stress of the coated film gradually increases. The relative minimum point and the relative maximum point of the compressive stress are formed at a point where the decrease in the voltage turns to increase (that is, at a point where switching from "the first cycle" to "the second cycle" is made) and at a point where the increase in the voltage turns to decrease (that is, at a point where switching from "the second cycle" to "the first cycle" is made), respectively.

The substrate bias voltage was varied relative to the elapsed time, so that the relative maximum point and the relative minimum point or continuous increase or decrease in the strength distribution of the compressive stress in the coated film can be formed.

TABLE 21

| No. | Compressive Stress at Surface | First Intermediate Point | Relative Minimum Point | Second Intermediate Point | Relative Maximum Point | Relative Minimum Point Count/Distance | Relative Maximum Point Count/Distance | Compressive Stress at Bottom Surface |
|---|---|---|---|---|---|---|---|---|
| Example 31 | –5 GPa | 25% 0.75 μm | –2.0 GPa to –1.6 GPa | 50% 1.5 μm | –5 GPa | 2/1.5 μm | 1/— μm | –5 GPa |
| Example 32 | –5 GPa | 8.3% 0.25 μm | –2.0 GPa to –1.6 GPa | 16.7% 0.5 μm | –5.2 GPa to –4.8 GPa | 6/0.5 μm | 5/0.5 μm | –5 GPa |
| Example 33 | –5 GPa | 1.7% 0.05 μm | –2.0 GPa to –1.6 GPa | 3.3% 0.1 μm | –5.4 GPa to –4.5 GPa | 30/0.1 μm | 29/0.1 μm | –5 GPa |
| Example 34 | –5 GPa | 1.7% 0.05 μm | –2.0 GPa to –1.6 GPa | 5.0% 0.1 μm | –5.2 GPa to –4.5 GPa | 20/0.15 μm | 19/0.15 μm | –5 GPa |
| Example 35 | –7 GPa | 20% 0.6 μm | –1.1 GPa to –0.8 GPa | 40% 1.2 μm | –7.1 GPa to –6.8 GPa | 2/1.2 μm | 2/1.2 μm | –1 GPa |
| Example 36 | –5 GPa | 20% 0.6 μm | –3.3 GPa to –2.9 GPa | 40% 1.2 μm | –5.2 GPa to –4.8 GPa | 2/1.2 μm | 2/1.2 μm | –3 GPa |

It is noted that numeric values in a field of the compressive stress at the surface and in a field of the compressive stress at the bottom surface in Table 21 above show compressive stresses exhibited at the surface of the coated film and at the bottom surface of the coated film respectively. In addition, numeric values in a field of the first intermediate point and in a field of the second intermediate point show distances in the direction of thickness of the coated film from the surface of the coated film to the first intermediate point and to the second intermediate point respectively (a numeric value shown with "%" is a value relative to the thickness of the coated film, accompanied by the indication with "μm"). Moreover, numeric values in a field of the relative minimum point and in a field of the relative maximum point show compressive stresses at that relative minimum point and relative maximum point respectively (though the numeric value is shown as a range, it is assumed that the compressive stress attains any substantially identical value within this range). In addition, relative minimum point count/distance and relative maximum point count/distance represent the number of relative minimum points and relative maximum points present between the surface of the coated film and the bottom surface of the coated film, as well as a distance between the relative minimum points and a distance between the relative maximum points, respectively.

The surface-coated cutting tool according to the present invention in Examples 31 to 36 includes the base material and the coated film formed on the base material. The coated film serves as the outermost layer on the base material and has compressive stress. The compressive stress is varied so as to have strength distribution in a direction of thickness of the coated film, and the strength distribution is characterized in that the compressive stress at the surface of the coated film continuously decreases from the surface of the coated film toward the first intermediate point located between the surface of the coated film and the bottom surface of the coated film and the compressive stress attains the relative minimum point at the first intermediate point, and that the compressive stress continuously increases from the first intermediate point toward the second intermediate point located between the first intermediate point and the bottom surface of the coated film and attains the relative maximum point at the second intermediate point, and the strength distribution has one or more similar relative minimum point and one or more similar relative maximum point between the second intermediate point and the bottom surface of the coated film. These relative minimum points and relative maximum points are present in an alternate and repeated manner in this order. In each example, the compressive stress at each relative minimum point attains a substantially identical value and the compressive stress at each relative maximum point attains a substantially identical value. The relative minimum points or the relative maximum points are present at substantially equal intervals. That is, this strength distribution shows exemplary strength distribution according to the fourth embodiment described above.

For the purpose of comparison, a surface-coated cutting tool was fabricated in a similar manner, except for a condition that the substrate bias voltage was uniformly raised from –20V to –150V taking 60 minutes, after evaporation of the metal ion from the target made of alloy is started (Comparative Example 7).

In the surface-coated cutting tool according to Comparative Example 7, the strength distribution of the compressive stress of the coated film had no relative minimum point nor relative maximum point and the compressive stress uniformly increased from the bottom surface of the coated film to the surface of the coated film.

Examples 37 to 40

<Fabrication of Surface-Coated Cutting Tool>

Initially, a base material the same as that used in Examples 31 to 36 was employed as the base material for the surface-coated cutting tool, and this base material was attached to a cathode arc ion plating apparatus.

In succession, the pressure within the chamber of the apparatus was lowered by means of a vacuum pump, and the temperature of the base material was heated to 450° C. by means of a heater provided in the apparatus. The chamber was evacuated until the pressure within the chamber attained to $1.0\times10^4$ Pa.

Thereafter, argon gas was introduced and the pressure within the chamber was held at 3.0 Pa. The voltage of a substrate bias power supply of the base material was gradually raised to −1500V, and cleaning of the surface of the base material was performed for 15 minutes. Thereafter, the argon gas was exhausted.

Then, a target made of alloy serving as a metal evaporation source was set such that $Al_{0.6}Ti_{0.2}Si_{0.1}Cr_{0.1}N$ is formed to a thickness of 3 μm as a coated film formed on the base material to be in direct contact therewith. Nitrogen serving as the reactive gas was introduced, the temperature of the base material (substrate) was set to 450° C., the reactive gas pressure was set to 4.0 Pa, and the substrate bias voltage was varied as shown in Table 22 below. In this manner, an arc current of 100A was supplied to the cathode electrode for 60 minutes and metal ions were generated from an arc type evaporation source, whereby the surface-coated cutting tool according to the present invention of Examples 37 to 40 having strength distribution of the compressive stress shown in Table 23 below was fabricated.

TABLE 22

| No. | First Cycle (Time/Substrate Bias Voltage) | Second Cycle (Time/Substrate Bias Voltage) |
|---|---|---|
| Example 37 | 5 minutes −210 V to −20 V | 5 minutes −20 V to −210 V |
| Example 38 | 5 minutes −210 V to −60 V | 5 minutes −60 V to −210 V |
| Example 39 | 5 minutes −210 V to −100 V | 5 minutes −100 V to −210 V |
| Example 40 | 5 minutes −210 V to −150 V | 5 minutes −150 V to −210 V |

The "first cycle" and the "second cycle" in Table 22 above, as in Table 20, indicate that the substrate bias voltage is applied as a result of alternately repeating, for 60 minutes, these cycles lasting for the time period shown in the fields of the first and second cycles (the cycle starts from the "first cycle"). In addition, a numeric value of the time and the voltage in each field, as in Table 20, shows a substrate bias voltage set during the elapsed time.

TABLE 23

| No. | Compressive Stress at Surface | First Intermediate Point | Relative Minimum Point | Second Intermediate Point | Relative Maximum Point | Relative Minimum Point Count/ Distance | Relative Maximum Point Count/ Distance | Compressive Stress at Bottom Surface |
|---|---|---|---|---|---|---|---|---|
| Example 37 | −7 GPa | 8.3% 0.25 μm | −1.1 GPa to −0.8 GPa | 16.7% 0.5 μm | −7.1 GPa to −6.8 GPa | 6/0.5 μm | 5/0.5 μm | −7 GPa |
| Example 38 | −7 GPa | 8.3% 0.25 μm | −2.2 GPa to −1.8 GPa | 16.7% 0.5 μm | −7.1 GPa to −6.8 GPa | 6/0.5 μm | 5/0.5 μm | −7 GPa |
| Example 39 | −7 GPa | 8.3% 0.25 μm | −4.2 GPa to −3.8 GPa | 16.7% 0.5 μm | −7.1 GPa to −6.8 GPa | 6/0.5 μm | 5/0.5 μm | −7 GPa |
| Example 40 | −7 GPa | 8.3% 0.25 μm | −5.3 GPa to −4.9 GPa | 16.7% 0.5 μm | −7.1 GPa to −6.8 GPa | 6/0.5 μm | 5/0.5 μm | −7 GPa |

It is noted that numeric values in a field of the compressive stress at the surface and in a field of the compressive stress at the bottom surface in Table 23 above, as in Table 21, show compressive stresses exhibited at the surface of the coated film and at the bottom surface of the coated film respectively. In addition, numeric values in a field of the first intermediate point and in a field of the second intermediate point, as in Table 21, also show distances in the direction of thickness of the coated film from the surface of the coated film to respective intermediate points (a numeric value shown with "%" is a value relative to the thickness of the coated film, accompanied by the indication with "μm"). Moreover, numeric values in a field of the relative minimum point and in a field of the relative maximum point, as in Table 21, also show compressive stresses at those points respectively (though the numeric value is shown as a range, it is assumed that the compressive stress attains any substantially identical value within this range). In addition, relative minimum point count/distance and relative maximum point count/distance, as in Table 21, represent the number of relative minimum points and relative maximum points present between the surface of the coated film and the bottom surface of the coated film, as well as a distance between the relative minimum points and a distance between the relative maximum points, respectively.

The surface-coated cutting tool according to the present invention in Examples 37 to 40 includes the base material and the coated film formed on the base material. The coated film serves as the outermost layer on the base material and has compressive stress. The compressive stress is varied so as to have strength distribution in a direction of thickness of the coated film, and the strength distribution is characterized in that the compressive stress at the surface of the coated film continuously decreases from the surface of the coated film toward the first intermediate point located between the surface of the coated film and the bottom surface of the coated film and the compressive stress attains the relative minimum point at the first intermediate point, and that the compressive stress continuously increases from the first intermediate point toward the second intermediate point located between the first intermediate point and the bottom surface of the coated film and attains the relative maximum point at the second intermediate point, and the strength distribution has one or more similar relative minimum point and one or more similar relative maximum point between the second intermediate point and the bottom surface of the coated film. These relative minimum points and relative maximum points are present in an alternate and repeated manner in this order. In each example, the compressive stress at the relative minimum point attains a substantially identical value and the compressive stress at the relative maximum point attains a substantially identical value. The relative minimum points and the relative maximum points are present at substantially equal intervals. That is, this strength distribution shows exemplary strength distribution according to the fourth embodiment described above.

For the purpose of comparison, a surface-coated cutting tool was fabricated in a similar manner, except for a condition that the substrate bias voltage was maintained at −75V for 60 minutes, after evaporation of the metal ion from the target made of alloy is started (Comparative Example 8).

In the surface-coated cutting tool according to Comparative Example 8, there was no strength distribution of the compressive stress of the coated film and the compressive stress was constant from the bottom surface of the coated film to the surface of the coated film.

<Evaluation of Wear-Resistance of Surface-Coated Cutting Tool>

Each of the surface-coated cutting tools according to Examples 31 to 40 and Comparative Examples 7 and 8 fabricated as above was subjected to a wet (water-soluble emulsion) continuous cutting test and a wet interrupted cutting test under the condition shown in Table 1 above. Then, the time at which a flank wear width at the cutting edge exceeds 0.2 mm was measured as the cutting time.

Tables 24 and 25 show the cutting time measured as described above as the result of evaluation of wear resistance of the surface-coated cutting tool. As the cutting time is longer, wear resistance is superior. In addition, in the continuous cutting test, shine on a finished surface of a material to be cut was also observed. Tables 24 and 25 also show the result of observation. Here, “shiny” indicates that the finished surface of the material to be cut had a shine, while “dim” indicates that the finished surface of the material to be cut had no shine but was dim.

As can clearly be seen from Tables 24 and 25, in both of the continuous cutting test and the interrupted cutting test, as compared with the surface-coated cutting tool in Comparative Examples 7 and 8, it was confirmed that the surface-coated cutting tool according to the present invention in Examples 31 to 40 attained further improved wear resistance, had a shine on the finished surface, and attained excellent resistance to film chipping and further improved life.

<Evaluation of Toughness of Surface-Coated Cutting Tool>

Each of the surface-coated cutting tools according to Examples 31 to 40 and Comparative Examples 7 and 8 fabricated as above was subjected to a test for evaluating toughness under the condition shown below.

As to the condition for cutting, specifically, as shown in Table 1 above, a block (300 mm length×150 mm width) including 50 through holes in an S50C material was used as a material to be cut. Dry milling cutting was performed under such a condition that a cutting speed was set to 180 m/min, cutting was set to 2.0 mm, and a feed rate was increased from 0.10 mm/cutting edge by 0.05 mm/cutting edge for each length of cutting of 300 mm.

Tables 24 and 25 show the measured maximum feed as the result of evaluation of toughness of the surface-coated cutting tool. As the maximum feed rate is larger, toughness is superior.

As can clearly be seen from Tables 24 and 25, as compared with the surface-coated cutting tool in Comparative Examples 7 and 8, it was confirmed that the surface-coated cutting tool according to the present invention in Examples 31 to 40 attained further improved toughness.

TABLE 24

| No. | Evaluation of Wear Resistance: Continuous Cutting Test | Evaluation of Wear Resistance: Interrupted Cutting Test | Evaluation of Toughness |
|---|---|---|---|
| Example 31 | 51 minutes (shiny) | 39 minutes | 0.7 mm/cutting edge |
| Example 32 | 57 minutes (shiny) | 49 minutes | 0.75 mm/cutting edge |
| Example 33 | 65 minutes (shiny) | 56 minutes | 0.8 mm/cutting edge |
| Example 34 | 63 minutes (shiny) | 59 minutes | 0.8 mm/cutting edge |
| Example 35 | 53 minutes (shiny) | 43 minutes | 0.8 mm/cutting edge |
| Example 36 | 47 minutes (shiny) | 47 minutes | 0.8 mm/cutting edge |
| Comparative Example 7 | 3 minutes (dim) | 10 seconds | 0.1 mm/cutting edge |

TABLE 25

| No. | Evaluation of Wear Resistance: Continuous Cutting Test | Evaluation of Wear Resistance: Interrupted Cutting Test | Evaluation of Toughness |
|---|---|---|---|
| Example 37 | 79 minutes (shiny) | 47 minutes | 0.65 mm/cutting edge |
| Example 38 | 74 minutes (shiny) | 63 minutes | 0.8 mm/cutting edge |
| Example 39 | 65 minutes (shiny) | 67 minutes | 0.85 mm/cutting edge |
| Example 40 | 62 minutes (shiny) | 59 minutes | 0.75 mm/cutting edge |
| Comparative Example 8 | 8 minutes (dim) | 12 seconds | 0.1 mm/cutting edge |

The embodiments and examples disclosed above are by way of illustration and are not to be taken by way of limitation, the spirit and scope of the present invention being limited not by the embodiments and examples above but by the claims and intended to include all modifications and variations within the scope of the claims.

The invention claimed is:

1. A surface-coated cutting tool, comprising:

a base material; and a coated film formed on said base material; wherein said coated film serves as an outermost layer on said base material and has compressive stress, said compressive stress is varied so as to have strength distribution in a direction of thickness of said coated film, and said strength distribution is characterized in that the compressive stress at a surface of said coated film continuously decreases from said surface of said coated film toward a first intermediate point located between said surface of said coated film and a bottom surface of said coated film and the compressive stress attains a relative minimum point at said first intermediate point.

2. The surface-coated cutting tool according to claim 1, wherein said strength distribution is characterized in that a maximum compressive stress is attained at said surface of said coated film and the compressive stress maintains a constant value from said first intermediate point to said bottom surface of said coated film.

3. The surface-coated cutting tool according to claim 2, wherein said compressive stress of the entire coated film is stress in a range from at least −15 GPa to at most 0 GPa.

4. The surface-coated cutting tool according to claim 2, wherein said first intermediate point is located at a position distant from said surface of said coated film by at least 0.1% to at most 50% of the thickness of said coated film.

5. The surface-coated cutting tool according to claim 2, wherein said compressive stress at said first intermediate point is set to a value comparable to 20 to 90% of the compressive stress at said surface of said coated film.

6. The surface-coated cutting tool according to claim 5, wherein said compressive stress at said first intermediate point is set to a value comparable to 40 to 80% of the compressive stress at said surface of said coated film.

7. The surface-coated cutting tool according to claim 2, wherein said compressive stress attains maximum at said surface of said coated film, the maximum compressive stress is maintained across a prescribed distance from said surface of said coated film toward said first intermediate point, and thereafter said compressive stress continuously decreases toward said first intermediate point.

8. The surface-coated cutting tool according to claim 1, wherein said strength distribution is characterized in that said compressive stress continuously increases from said first intermediate point toward said bottom surface of said coated film.

9. The surface-coated cutting tool according to claim 8, wherein said compressive stress of the entire coated film is the stress in a range from at least −15 GPa to at most 0 GPa.

10. The surface-coated cutting tool according to claim 8, wherein said first intermediate point is located at a position distant from said surface of said coated film by at least 0.1% to at most 50% of the thickness of said coated film.

11. The surface-coated cutting tool according to claim 8, wherein said compressive stress attains maximum at said surface of said coated film.

12. The surface-coated cutting tool according to claim 8, wherein said compressive stress at said first intermediate point is set to a value comparable to 20 to 90% of the compressive stress at said surface of said coated film.

13. The surface-coated cutting tool according to claim 12, wherein said compressive stress at said first intermediate point is set to a value comparable to 40 to 80% of the compressive stress at said surface of said coated film.

14. The surface-coated cutting tool according to claim 8, wherein said compressive stress at said surface of said coated film is maintained across a prescribed distance from said surface of said coated film toward said first intermediate point, and thereafter said compressive stress continuously decreases toward said first intermediate point.

15. The surface-coated cutting tool according to claim 1, wherein said strength distribution is characterized in that said compressive stress continuously increases from said first intermediate point toward a second intermediate point located between said first intermediate point and said bottom surface of said coated film and attains a relative maximum point at said second intermediate point.

16. The surface-coated cutting tool according to claim 15, wherein said compressive stress of the entire coated film is the stress in a range from at least −15 GPa to at most 0 GPa.

17. The surface-coated cutting tool according to claim 15, wherein said first intermediate point is located at a position distant from said surface of said coated film by at least 0.1% to at most 50% of the thickness of said coated film.

18. The surface-coated cutting tool according to claim 15, wherein said second intermediate point is located at a position distant from said surface of said coated film by at least 0.2% to at most 95% of the thickness of said coated film.

19. The surface-coated cutting tool according to claim 15, wherein said compressive stress attains maximum at said surface of said coated film.

20. The surface-coated cutting tool according to claim 15, wherein said compressive stress at said first intermediate point is set to a value comparable to 20 to 90% of the compressive stress at said surface of said coated film.

21. The surface-coated cutting tool according to claim 20, wherein said compressive stress at said first intermediate point is set to a value comparable to 40 to 80% of the compressive stress at said surface of said coated film.

22. The surface-coated cutting tool according to claim 15, wherein said compressive stress at said surface of said coated film is maintained across a prescribed distance from said surface of said coated film toward said first intermediate point, and thereafter said compressive stress continuously decreases toward said first intermediate point.

23. The surface-coated cutting tool according to claim 1, wherein said strength distribution is characterized in that said compressive stress continuously increases from said first intermediate point toward a second intermediate point located between said first intermediate point and said bottom surface of said coated film and attains a relative maximum point at said second intermediate point, and said strength distribution has one or more similar said relative minimum point between said second intermediate point and said bottom surface of said coated film.

24. The surface-coated cutting tool according to claim 23, wherein said strength distribution has one or more similar said relative maximum point between said second intermediate point and said bottom surface of said coated film.

25. The surface-coated cutting tool according to claim 23, wherein said strength distribution has one or more said similar relative minimum point and one or more said similar relative maximum point in an alternate and repeated manner in this order between said second intermediate point and said bottom surface of said coated film.

26. The surface-coated cutting tool according to claim 23, wherein said compressive stress of the entire coated film is the stress in a range from at least −15 GPa to at most 0 GPa.

27. The surface-coated cutting tool according to claim 23, wherein said first intermediate point is located at a position distant from said surface of said coated film by at least 0.1% to at most 40% of the thickness of said coated film.

28. The surface-coated cutting tool according to claim 23, wherein said second intermediate point is located at a position distant from said surface of said coated film by at least 0.2% to at most 80% of the thickness of said coated film.

29. The surface-coated cutting tool according to claim 23, wherein said compressive stress attains maximum at said surface of said coated film.

30. The surface-coated cutting tool according to claim 23, wherein said compressive stress at said first intermediate point is set to a value comparable to 10 to 80% of the compressive stress at said surface of said coated film.

31. The surface-coated cutting tool according to claim 30, wherein said compressive stress at said first intermediate point is set to a value comparable to 20 to 60% of the compressive stress at said surface of said coated film.

32. The surface-coated cutting tool according to claim 23, wherein said compressive stress at said surface of said coated film is maintained across a prescribed distance from said surface of said coated film toward said first intermediate point, and thereafter said compressive stress continuously decreases toward said first intermediate point.

* * * * *